United States Patent [19]
Komine et al.

[11] Patent Number: 5,908,482
[45] Date of Patent: Jun. 1, 1999

[54] METHOD FOR PRODUCING A SILICA GLASS

[75] Inventors: Norio Komine, Sagamihara; Hiroyuki Hiraiwa, Yokohama, both of Japan

[73] Assignee: Nikon Corporation, Japan

[21] Appl. No.: 08/927,630

[22] Filed: Sep. 11, 1997

Related U.S. Application Data

[62] Division of application No. 08/582,266, Jan. 3, 1996, Pat. No. 5,707,908.

[30] Foreign Application Priority Data

| Jan. 6, 1995 | [JP] | Japan | 7-000479 |
| Mar. 20, 1995 | [JP] | Japan | 7-061038 |
| Mar. 20, 1995 | [JP] | Japan | 7-061039 |
| Apr. 21, 1995 | [JP] | Japan | 7-096687 |
| Jun. 29, 1995 | [JP] | Japan | 7-164040 |

[51] Int. Cl.$^6$ .............. C03B 20/00; C03C 3/04; C03C 3/06
[52] U.S. Cl. ................ 65/17.6; 65/63; 65/111; 65/117
[58] Field of Search .................. 501/53, 54, 56, 501/12; 65/17.4, 17.6, 63, 111, 117, 32.1, DIG. 8

[56] References Cited

U.S. PATENT DOCUMENTS

| 5,086,352 | 2/1992 | Yamagata et al. . |
| 5,325,230 | 6/1994 | Yamagata et al. . |
| 5,326,729 | 7/1994 | Yaba et al. . |
| 5,349,456 | 9/1994 | Iwanaga et al. . |
| 5,364,433 | 11/1994 | Nishimura et al. . |
| 5,410,428 | 4/1995 | Yamagata et al. . |
| 5,616,159 | 4/1997 | Araujo et al. . |
| 5,668,067 | 9/1997 | Araujo et al. . |
| 5,679,125 | 10/1997 | Hiraiwa et al. . |
| 5,702,495 | 12/1997 | Hiraiwa et al. . |
| 5,707,908 | 1/1998 | Komine et al. . |
| 5,735,921 | 4/1998 | Araujo et al. . |

FOREIGN PATENT DOCUMENTS

| 0401845 | 12/1990 | European Pat. Off. . |
| 0483752 | 5/1992 | European Pat. Off. . |
| 0636586 | 2/1995 | European Pat. Off. . |
| 6-199539 | 7/1994 | Japan . |

*Primary Examiner*—Steven P. Griffin
*Attorney, Agent, or Firm*—Pennie & Edmonds LLP

[57] ABSTRACT

A silica glass has a structure determination temperature of 1200K or lower and a hydrogen molecule concentration of $1\times10^{17}$ molecules/cm$^3$ or more. The silica glass is used together with light in a wavelength region of 400 nm or shorter. The silica glass is produced by heating a silica glass ingot having a hydrogen molecule concentration of $1\times10^{17}$ molecules/cm$^3$ or more to a temperature of 1200–1350K, retaining the ingot at that temperature for a given period of time, and then, cooling the ingot to a temperature of 1000K or lower at a temperature-lowering rate of 50K/hr or less to anneal the ingot.

6 Claims, 13 Drawing Sheets

METHOD FOR PRODUCING A SILICA GLASS

This is a division of application Ser. No. 08/582,266, filed Jan. 3, 1996, now U.S. Pat. No. 5,707,908.

BACKGROUND OF THE INVENTION

1. Field of the Invention

The present invention relates to a silica glass, optical members including the glass, and a method for producing the glass More particularly, it relates to a silica glass used for optical systems which use ultraviolet light of 400 nm or shorter and light of vacuum ultraviolet wavelength region, such as excimer laser lithography, optical members and a method for producing the silica glass.

2. Related Background Art

Hitherto, exposure apparatuss called stepper are used in photolithographic techniques according to which fine patterns of integrated circuits are exposed and transferred onto wafers such as of silicon. With recent increase in integration of LSI, wavelength of light sources in the stepper becomes gradually shorter such as g-line (436 nm), i-line (365 nm), KrF excimer laser beam (248 nm) and ArF excimer laser beam (193 nm). In general, synthetic silica glasses are used as optical glasses for lenses of illumination optical systems or projection optical systems of steppers because high transmittance for light of wavelength region shorter than i-line and ultraviolet light resistance are required.

However, even in the case of the synthetic silica glasses, when they are irradiated with ultraviolet light of high output or excimer laser beam for a long time, there appear an absorption region of 215 nm produced by structural defect called E' center (having a structure of $\equiv$Si where $\equiv$ does not mean a triple bond, but means that Si bonds to three oxygen atoms and "." indicates an unpaired electron) and an absorption region of 260 nm produced by structural defect called NBOHC (Non-Bridging Oxygen Hole Center; having a structure of $\equiv$Si—O.) which cause considerable decrease of transmittance for light of ultraviolet region. These silica glasses inferior in ultraviolet light resistance are not suitable as optical members such as optical lenses for ultraviolet light mentioned above.

For improving the ultraviolet light resistance of such silica glasses, it is known to subject silica glasses to a heat treatment in a hydrogen atmosphere (e.g., Japanese Patent Application Laid-Open Gazette (Kokai) No. 1-201664). Furthermore, it is proposed to improve excimer resistance by doping silica glasses with hydrogen molecules (e.g., Japanese Patent Application Laid-Open Gazette (Kokai) No. 3-109233).

SUMMARY OF THE INVENTION

The inventors have found that the conventional silica glasses have the following problems and a sufficient ultraviolet light resistance has not yet been obtained.

That is, the doped hydrogen molecules have the effect to terminate the structural defects produced by irradiation with ultraviolet light, but the effect of the hydrogen molecules is merely the restoration of the produced structural defects and cannot thoroughly remove the structural defects. For example, hydrogen molecules react with E' center produced by irradiation with ultraviolet light to convert it to $\equiv$Si—H bond and, consequently, reduce concentration of E' center, but when glasses are again irradiated with ultraviolet light, the $\equiv$Si—H bond is readily converted to E' center.

Furthermore, the conventional silica glasses suffer from the problems that uniformity is deteriorated due to increase of refractive index of the portions irradiated with ultraviolet light, and, besides, strain increases or dents are produced by irradiation with ultraviolet light, and, as a result, imaging performance of optical systems where they are used is considerably deteriorated. That is, there are no silica glasses which have simultaneously attained the requirements (i) increment of refractive index for light of 633 nm after irradiated with $1 \times 10^6$ pulses of ArF excimer laser at an average one-pulse energy density of 100 mJ/cm² is $6 \times 10^{-6}$ or less, (ii) quantity of the surface dents after irradiated with $1 \times 10^6$ pulses of ArF excimer laser at an average one-pulse energy density of 100 mJ/cm² is 0.05 $\mu$m or less per one surface, and (iii) the maximum amount of strain against light of 633 nm after irradiated with $5 \times 10^6$ pulses of ArF excimer laser at an average one-pulse energy density of 50 mJ/cm² is 10 nm/cm or less.

Accordingly, the object of the present invention is to provide a silica glass which is improved in ultraviolet light resistance, inhibited from production of structural defects per se such as E' center and NBOHC, and sufficiently inhibited from increase of refractive index and occurrence of dents and strain even after irradiation with ultraviolet light of short wavelength and high output or excimer laser beam for a long time.

As a result of intensive research conducted by the inventors in an attempt to attain the above object, it has been found that the structure determining temperature of silica glass greatly affects the ultraviolet light resistance and increase of refractive index and occurrence of dents and strain can be sufficiently inhibited by lowering the structure determination temperature to lower than a certain level in a silica glass containing hydrogen molecules in an amount larger than a certain amount. Thus, the present invention has been accomplished.

The silica glass (fused silica, quartz glass) of the present invention is used together with light of a wavelength region of 400 nm or shorter and is characterized by having a structure determination temperature of 1200K or lower and a hydrogen molecule concentration of $1 \times 10^{17}$ molecules/cm³ or more.

Furthermore, the optical member (optical component) of the present invention is an optical member for use with light of a wavelength region of 400 nm or shorter and is characterized by containing the silica glass of the present invention.

Moreover, the exposure apparatus (exposing device) of the present invention is an exposure apparatus which uses light of a wavelength region of 400 nm or shorter as exposure light (exposing light) and characterized by being provided with the optical member containing the silica glass of the present invention.

Further, the method for producing the silica glass according to the present invention is characterized by including the steps of heating a silica glass ingot having a hydrogen molecule concentration of $1 \times 10^{17}$ molecules/cm³ or more to a temperature of 1200–1350K, maintaining the ingot at that temperature for a given period, and, then; cooling the ingot to a temperature of 1000K or lower at a cooling rate (temperature-lowering rate) of 50K/hr or less thereby to anneal the ingot, and this method makes it possible to produce a silica glass having a structure determining temperature of 1200K or lower and a hydrogen molecule concentration of $1 \times 10^{17}$ molecules/cm³ or more.

The "structure determination temperature" herein used is a factor introduced as a parameter which expresses structural stability of silica glass and will be explained in detail below. The fluctuation in density of silica glass at room temperature, namely, structural stability is determined by density of the silica glass in the state of melt at high temperatures and density and structure of the silica glass when the density and the structure are frozen at around the glass transition point in the process of cooling. That is, thermodynamic density and structure corresponding to the temperature at which the density and structure are frozen are also retained at room temperature. The temperature when the density and structure are frozen is defined to be "structure determination temperature" in the present invention.

The structure determination temperature can be obtained in the following manner. First, a plurality of silica glass test pieces are retained at a plurality of temperatures within the range of 1073–1700K for a period longer than the structure relaxation time (a time required for the structure of the silica glass being relaxed at that temperature) in the air in a tubular oven as shown in the accompanying. FIG. 1, thereby to allow the structure of the respective test pieces to reach the structure at the retention temperature. As a result, each of the test pieces has a structure which is in the thermal equilibrium state at the retention temperature. In FIG. 1, 101 indicates a test piece, 102 indicates a silica glass tube, 103 indicates a heater, 104 indicates a thermocouple, 105 indicates a beaker, and 106 indicates liquid nitrogen.

Then, the test pieces are introduced not into water, but into liquid nitrogen in 0.2 second to quench them. If they are introduced into water, quenching is insufficient and structural relaxation occurs in the process of cooling, and the structure at the retention temperature cannot be fixed. Moreover, it can be considered that adverse effect may occur due to the reaction between water and the silica glass. In the present invention, super-quenching can be attained by introducing the test pieces into liquid nitrogen as compared with introduction into water, and by this operation, it becomes possible to fix the structure of the test pieces to the structure at the retention time. In this way, for the first time, the structure determination temperature can be allowed to coincide with the retention temperature.

The thus obtained test pieces having various structure determination temperatures (equal to the retention temperatures here) are subjected to measurement of Raman scattering, and 606 $cm^{-1}$ line intensity is obtained as a ratio to 800 $cm^{-1}$ line intensity. A graph is prepared with employing as a variable the structure determination temperature for 606 $cm^{-1}$ line intensity and this is used as a calibration curve. A structure determination temperature of a test piece of which the structure determination temperature is unknown can be inversely calculated from the measured 606 $cm^{-1}$ line intensity using the calibration curve. In the present invention, a temperature obtained in the above manner on a silica glass the structure determination temperature of which is unknown is employed as the structure determination temperature of the silica glass.

The present invention will be more fully understood from the detailed description given hereinbelow and the accompanying drawings, which are given by way of illustration only and are not to be considered as limiting the present invention.

Further scope of applicability of the present invention will become apparent from the detailed description given hereinafter However, it should be understood that the detailed description and specific examples, while indicating preferred embodiments of the invention, are given by way of illustration only, since various changes and modifications within the spirit and scope of the invention will be apparent to those skilled in the art from this detailed description.

DESCRIPTION OF THE PREFERRED EMBODIMENTS

Figure 1:
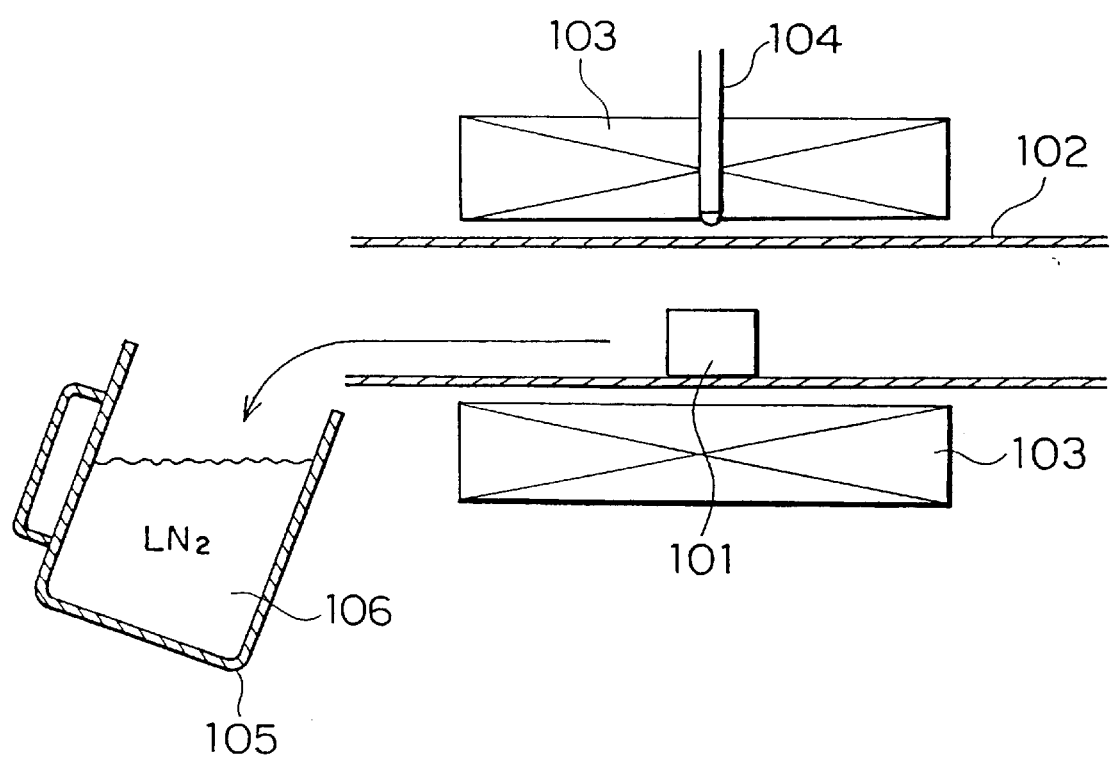
FIG. 1 is a schematic view of one example of the apparatus for measurement of the structure determination temperature according to the present invention.

First, the silica glass of the present invention will be explained.

The silica glass of the present invention is used together with light of the wavelength region of 400 nm or shorter and has a structure determination temperature of 1200K or lower and a hydrogen molecule concentration of $1 \times 10^{17}$ molecules/$cm^3$ or more.

By specifying the hydrogen molecule concentration to be $1 \times 10^{17}$ molecules/$cm^3$ or more and the structure determination temperature to be 1200K or lower as mentioned above, a silica glass having a sufficient ultraviolet light resistance as optical members for excimer laser lithography can be obtained.

Although the mechanism of increase in refractive index and occurrence of surface dents at the time of irradiation with ultraviolet light being inhibited in the silica glass containing the hydrogen molecules of the above concentration is not necessarily clear, the inventors consider as follows.

It is considered that the increase of refractive index and the occurrence of surface dents are caused by densification due to the structural change of the silica glass by irradiation with ultraviolet light. That is, the basic structure of the silica glass is photodecomposed by irradiation with ultraviolet light as shown below and then, they are bonded again to change the structure to the denser structure.

 (1)

The ≡Si is not a triple bond, but indicates that Si bonds to three oxygens.

Furthermore, the inventors have examined the correlation between increment of refractive index and amount of surface dents caused by irradiation with ArF excimer laser beam to find that they have the correlation of 1:1. Thus, they have found that both the phenomena are caused by densification of the silica glass.

The inventors have considered that when the silica glass which undergoes densification contains hydrogen molecule, the densification may be inhibited due to the formation of OH group, and they have actually ascertained that the densification can be inhibited by the presence of hydrogen molecules. It is considered that in this case, when hydrogen molecules are present in the process of photodecomposition shown by (1), the decomposition is terminated by ≡Si—OH H—Si≡ before changing to the denser structure and the silica glass is stabilized. It is further considered that when the silica glass contains hydrogen molecules, densification due to irradiation with ultraviolet light and simultaneously, decrease in density due to production of OH group are brought about and the densification is substantially inhibited by the offset of the two phenomena, and consequently, occurrence of strain can also be inhibited.

Such characteristics are not seen in all silica glasses, but the inventors have found that only the silica glasses having a structure determination temperature of 1200K or lower which is a parameter of structural stability, namely, silica glass having nearly an ideal structure to which hydrogen molecules are introduced exhibit the effect to inhibit increase of refractive index, etc. by irradiation with ultraviolet light. Meanwhile, the structure determination temperature of the silica glass of the present invention is quite lower than that of optical fibers, for example, which is typically about 1,450K.

The mechanism of the ultraviolet light resistance being improved with decrease in the structure determination temperature is also not necessarily clear, but the inventors consider as follows. The silica glass having a high structure determination temperature is considered to be structurally unstable. The bond angle of ≡Si—O—Si≡ in the network of silica glass has a certain distribution because of it being a glass and this distribution of bond angle includes structurally unstable ones. This distribution of bond angle comprises bridged tetrahedrons made of oxygen atoms and silicon atoms in the silica glass and the presence of the unstable bond angles is considered to be caused by the presence of the tetrahedrons in distorted state Such distorted bond portion is readily cut by irradiation with ultraviolet light to produce the defects such as detrimental E' center and NBOHC. On the other hand, it is considered that silica glasses of low structure determination temperature have few such distorted bond portions.

Accordingly, in the case of the silica glass of the present invention which has a hydrogen molecule concentration of $1 \times 10^{17}$ molecules/cm$^3$ or more and a structure determination temperature of 1200K or lower, the following requirements are simultaneously attained by the synergistic effects of the above properties: (i) increment of refractive index for light of 633 nm after irradiated with $1 \times 10^6$ pulses of ArF excimer laser at an average one-pulse energy density of 100 mJ/cm$^2$ is $6 \times 10^{-6}$ or less, (ii) quantity of the surface dents after irradiated with $1 \times 10^6$ pulses of ArF excimer laser at an average one-pulse energy density of 100 mJ/cm$^2$ is 0.05 μm or less per one surface, and (iii) the maximum amount of strain against light of 633 nm after irradiated with $5 \times 10^6$ pulses of ArF excimer laser at an average one-pulse energy density of 50 mJ/cm$^2$ is 10 nm/cm or less.

The amount of strain of glass here is defined as follows. That is, non-crystalline body such as glass is isotropic in all properties as far as it does not undergo strain due to the presence of stress inside thereof. However, in a distorted glass, there occurs optically a phenomenon of the double refraction. The double refraction is a phenomenon that when one incident light passes through an optical anisotropy, two refracted lights are obtained. These refracted lights are linear polarized lights of which vibration planes cross at right angles and since their refractive indexes differ, phase of these two refracted lights differ. In this case, amount of double refraction is the phase difference of the two refracted lights when the light passes through a unit length of a material. Usually, amount of strain is defined to be the amount of double refraction. In a precision optical system such as photolithographic apparatus, it is important for resolution of the optical system to reduce the amount of double refraction, namely, reduce internal strain of optical members as well as to improve uniformity of distribution of refractive index.

As to the mechanism of formation of the strain, the inventors consider as follows. That is, in imaging optical system, light does not necessarily uniformly transmit the whole face of optical lens member and there are the portions which are irradiated with light and not irradiated with light. For example, when light is condensed by one lens, even if the whole face of the lens is irradiated with lights the portion fixed to lens frame is not irradiated with light. Furthermore, in an optical system composed of a plurality of lenses, there is the case when light is intentionally partially and concentrically transmitted through a specific area of lens member. Further, there is the case when a specific area of lens member is irradiated with light in the form of a spot.

In the portion irradiated with ultraviolet light or the portion high in energy density of the irradiated ultraviolet light, the above-mentioned densification of the structure proceeds and on the other hand, in the portion not irradiated with ultraviolet light or the portion low in energy density of the irradiated ultraviolet light, such densification does not occur or the densification is small. Therefore, the portions differing in the degree of densification are produced in one lens member. It is considered that since the densification brings about shrinkage of the member, there occurs difference in the degree of shrinkage in the same lens member and a great stress is concentrated at the boundary between these portions to produce strain. It is further considered that the strain is similarly produced by the presence of space fluctuation in the energy density of ultraviolet light irradiated to the lens member. On the other hand, since the densification is inhibited in the silica glass of the present invention, occurrence of strain is inhibited.

The silica glass of the present invention has a chlorine concentration of preferably 50 ppm or less, especially preferably 10 ppm or less. Excimer laser beam resistance of silica glass tends to depend on the dissolved chlorine concentration and when the chlorine content is reduced to the above range, ultraviolet light resistance tends to increase.

Figure 2:
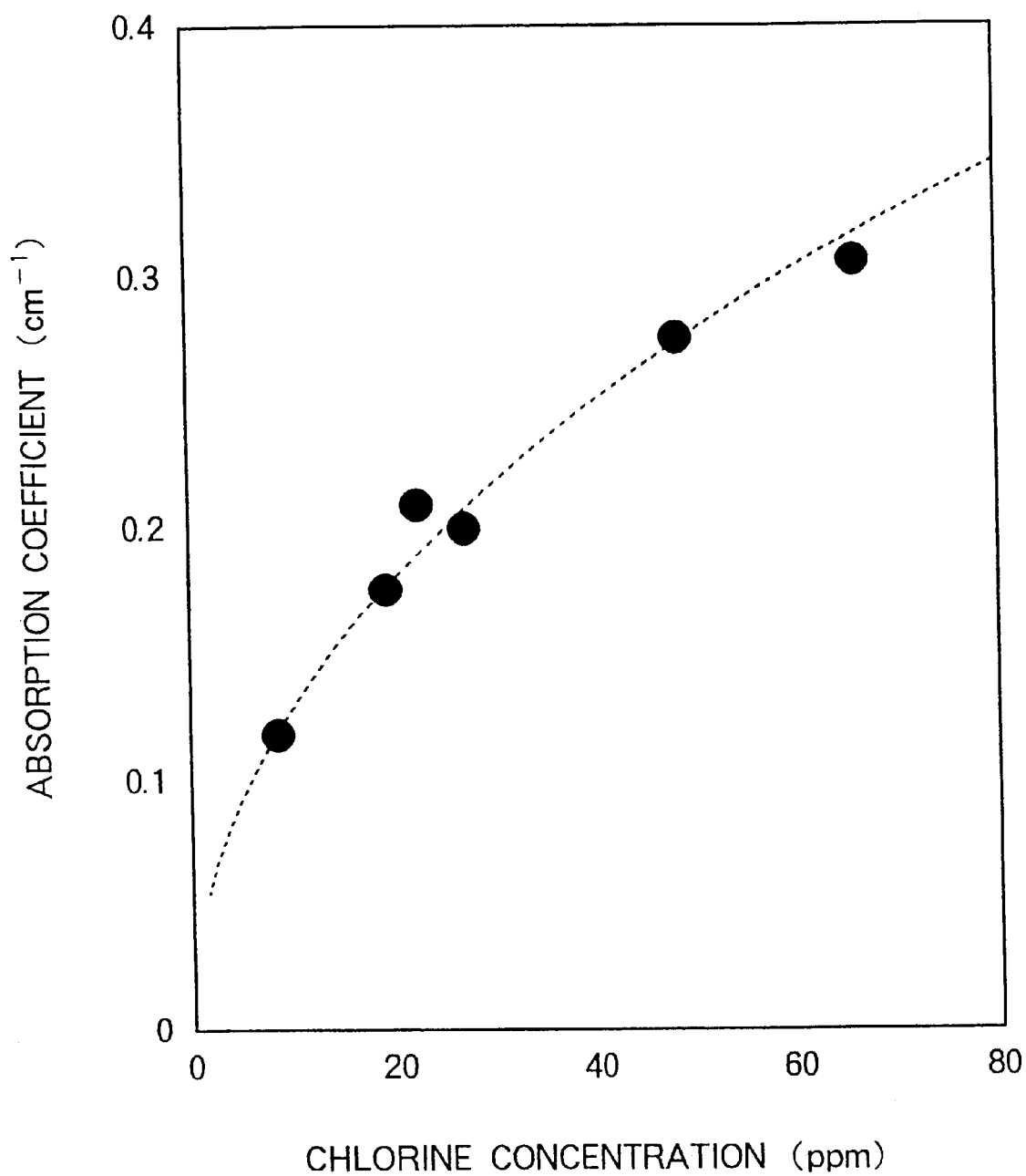
FIG. 2 is a graph which shows the relation between chlorine concentration and change in absorption coefficient (absorption factor).

The more detailed reasons are as follows. Chlorine would be present in the state of ≡Si—Cl, Cl$_2$, HCl, or the like in the silica glass. However, since absorptions of $Cl_2$ (325 nm) and HCl (2782 $cm^{-1}$) are not detected in the silica glass produced by direct method, the state of existing chlorine is considered to be ≡Si—Cl. It is considered that such ≡Si—Cl is readily converted to the harmful defect (E' center) upon irradiation with ultraviolet light. Therefore, the chlorine content is reduced to the above range, ultraviolet light resistance tends to increase and with decrease of the chlorine content in the silica glass, the excimer laser beam resistance required for optical members for excimer laser steppers tends to increase. FIG. 2 shows the relation between chlorine content and change in absorption coefficient for the light of 193 nm after irradiated with ArF excimer laser beam at one-pulse energy density: 100 $mJ/cm^2$ and repeated frequency: 100 Hz.

Absorption coefficient=ln(transmittance after irradiation/ transmittance before irradiation)/thickness of test piece The silica glass of the present invention has an OH group concentration of preferably 500–1300 ppm, especially preferably 500–1000 ppm. The silica glass containing an OH group concentration within the above range is structurally more stable as compared with other silica glasses and is especially excellent for photolithography.

The detailed reasons are as follows. As mentioned hereabove, the ≡Si—O—Si≡ bond angle in the network of silica glass has a certain distribution because of glass and structurally unstable distorted bond portion is contained. However, when OH group is contained within the above range, there is no need to bridge even with unstable bond angle, and, therefore, the tetrahedron can be close to the most stable structure. Accordingly, the silica glass containing OH group in a concentration of the above range is structurally stable as compared with other silica glasses and high in transmittance and purity, and, thus, this is especially excellent for photolithography.

Furthermore, ≡Si—Si≡, ≡Si—O—O—Si≡, dissolved oxygen molecules, etc. are known as factors which deteriorate the ultraviolet light resistance of silica glass. These precursors are readily converted to structural defects such as E' center and NBOHC to cause decrease in transmittance. In the silica glass of the present invention, it is preferred that there are no incomplete structures caused by the deviation from the stoichiometric ratio. For example; when OH group in the above range is contained, the silica glass tends to contain substantially no oxygen-shortage type defect absorption bands (7.6, 5.0 eV absorption bands). Furthermore, when the silica glass containing hydrogen molecules in the above range is irradiated with $1 \times 10^6$ pulses of ArF excimer laser beam at a one-pulse energy density of 100 $mJ/cm^2$, substantially no oxygen-excess type defect absorption band (4.8 eV absorption band) is produced. Due to the absence of these defects, high transmittances of at least 99.9% in internal transmittance for the light of the wavelength of g-line (436 nm)–i-line (365 nm) and KrF excimer laser beam (248 nm) and at least 99.8% in internal transmittance for the light of the wavelength of ArF excimer laser beam (193 nm) can be attained.

Moreover, it is preferred to use a silica glass of high purity of less than 50 ppb, more preferably 20 ppb in concentration of metallic impurities (Mg, Ca, Ti, Cr, Fe, Ni, Cu, Zn, Co, Mn, Na, K). Thus, the above-mentioned structural defects decrease to form a structure close to the ideal structure, and, furthermore, change of refractive index, change of plane and deterioration of transmittance caused by the metallic impurities diminish to improve the ultraviolet light resistance.

Next, the optical member and the exposure apparatus of the present invention will be explained. The optical member of the present invention includes the above silica glass of the present invention which has a structure determination temperature of 1200K or lower and a hydrogen molecule concentration of $1 \times 10^{17}$ molecules/$cm^3$ or more. Such optical member of the present invention has no special limitation except that it includes the above silica glass and is an optical member such as lens, prism or the like which is used together with light of wavelength region of 400 nm or shorter. The optical member of the present invention further includes a blank. Furthermore, the method for processing the silica glass of the present invention into the optical member of the present invention is not especially limited, and usual cutting method, abrasion method, etc. can be suitably employed.

The optical member of the present invention is provided with the silica glass excellent in ultraviolet light resistance sufficiently inhibited from increase of refractive index and formation of dents even if irradiated with ultraviolet light of high output or excimer laser beam for a long time as mentioned above, and, therefore, it is prolonged in life and can maintain a high resolving power over a long period of time as compared with conventional optical members.

Especially, since increase of refractive index, change of the surface and formation of strain cause considerable deterioration in imaging performance of optical lenses for ultraviolet light, the silica glass of the present invention sufficiently inhibited from change of these properties is suitably applied to optical members which require a high resolving power of 0.25 μm or less, such as lenses of projection optical system of ArF steppers. Moreover, the silica glass of the present invention is useful not only for lenses of projection optical system of steppers, but also for precision optical elements such as lenses of illumination optical system and etalon.

An exposure apparatus of the present invention will be described next. The exposure apparatus of the present invention is provided with the optical member comprising the silica glass of the present invention and uses light in the wavelength region of 400 nm or shorter as exposure light, and has no limitation except that it contains the silica glass as a lens of illumination optical system, projection optical system, or the like.

The present invention is preferably applied to the projection exposure apparatus, such as a so-called stepper, for projecting an image of patterns of reticle onto a wafer coated with a photoresist.

Figure 3:
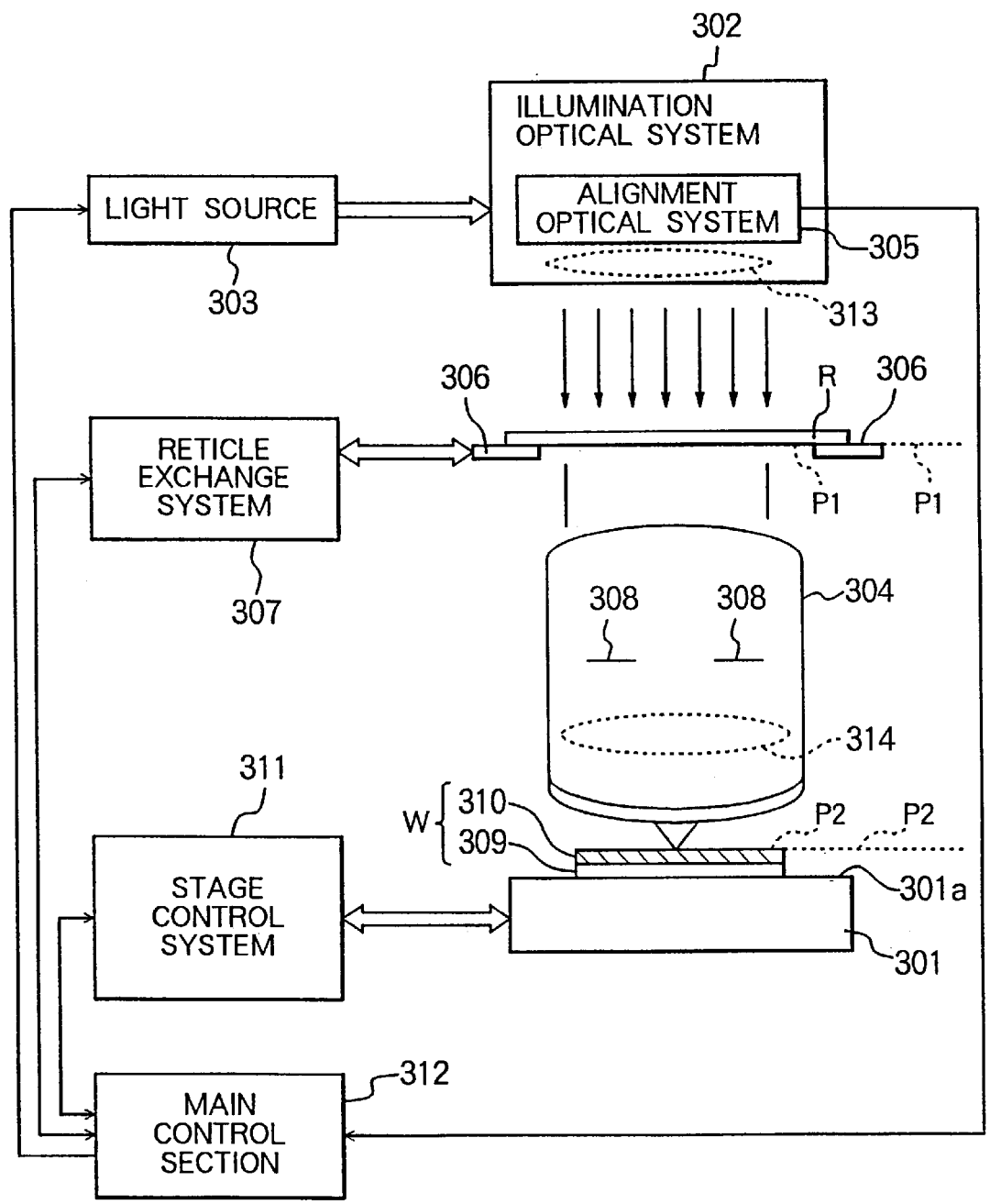
FIG. 3 is a block diagram showing the basic structure of an example of the exposure apparatus of the present invention.

FIG. 3 shows a basic structure of the exposure apparatus according to the present invention. As shown in FIG. 3, an exposure apparatus of the present invention comprises at least a wafer stage 301 allowing a photosensitive substrate W to be held on a main surface 301a thereof, an illumination optical system 302 for emitting vacuum ultraviolet light of a predetermined wavelength as exposure light and transferring a predetermined pattern of a mask (reticle R) onto the substrate W, a light source 303 for supplying the exposure light to the illumination optical system 302, a projection optical system (preferably a catadioptric one) 304 provided between a first surface P1 (object plane) on which the mask R is disposed and a second surface P2 (image plane) to which a surface of the substrate W is corresponded, for projecting an image of the pattern of the mask R onto the substrate W. The illumination optical system 302 includes an alignment optical system 305 for adjusting a relative positions between the mask R and the wafer W, and the mask R is disposed on a reticle stage 306 which is movable in parallel with respect to the main surface of the wafer stage 301. A reticle exchange system 307 conveys and changes a reticle (mask R) to be set on the reticle stage 306. The reticle exchange system 307 includes a stage driver for moving the reticle stage 306 in parallel with respect to the main surface 301*a* of the wafer stage 301. The projection optical system 304 has a space permitting an aperture stop 308 to be set therein. The sensitive substrate W comprises a wafer 309 such as a silicon wafer or a glass plate, etc., and a photosensitive material 310 such as a photoresist or the like coating a surface of the wafer 309. The wafer stage 301 is moved in parallel with respect to a object plane P1 by a stage control system 311. Further, since a main control section 312 such as a computer system controls the light source 303, the reticle exchange system 307, the stage control system 311 or the like, the exposure apparatus can perform a harmonious action as a whole.

The exposure apparatus of the present invention comprises an optical member which comprises the silica glass of the present invention, for example an optical lens consisting of the above-mentioned silica glass. More specifically, the exposure apparatus of the present invention shown in FIG. 3 can include the optical lens of the present invention as an optical lens 313 in the illumination optical system 302 and/or an optical lens 314 in the projection optical system 304.

As mentioned above, since the exposure apparatus of the present invention is provided with the optical member made of the silica glass which is excellent in ultraviolet light resistance sufficiently inhibited from increase of refractive index and formation of dents even if irradiated with ultraviolet light of high output or excimer laser beam for a long time, it is prolonged in life and can maintain a high resolving power over a long period of time as compared with conventional exposure apparatuss.

The techniques relating to an exposure apparatus of the present invention are described, for example, in U.S. patent applications Ser. Nos. 255,927, 260,398, 299,305, U.S. Pat. Nos. 4,497,015, 4,666,273, 5,194,893, 5,253,110, 5,333,035, 5,365,051, 5,379,091, or the like. The reference of U.S. patent application Ser. No. 255,927 teaches an illumination optical system (using a laser source) applied to a scan type exposure apparatus. The reference of U.S. patent application Ser. No. 260,398 teaches an illumination optical system (using a lamp source) applied to a scan type exposure apparatus. The reference of U.S. patent application Ser. No. 299,305 teaches an alignment optical system applied to a scan type exposure apparatus. The reference of U.S. Pat. No. 4,497,015 teaches an illumination optical system (using a lamp source) applied to a scan type exposure apparatus. The reference of U.S. Pat. No. 4,666,273 teaches a step and repeat type exposure apparatus capable of using the catadioptric projection optical system of the present invention. The reference of U.S. Pat. No. 5,194,893 teaches an illumination optical system, an illumination region, mask-side and reticle-side interferometers, a focusing optical system, alignment optical system, or the like. The reference of U.S. Pat. No. 5,253,110 teaches an illumination optical system (using a laser source) applied to a step-and-repeat type exposure apparatus. The '110 reference can be applied to a scan type exposure apparatus. The reference of U.S. Pat. No. 5,333,035 teaches an application of an illumination optical system applied to an exposure apparatus. The reference of U.S. Pat. No. 5,365,051 teaches a auto-focusing system applied to an exposure apparatus. The reference of U.S. Pat. No. 5,379,091 teaches an illumination optical system (using a laser source) applied to a scan type exposure apparatus. These documents are hereby incorporated by reference.

Next, the method for producing the silica glass of the present invention will be explained.

In the method for producing the silica glass of the present invention, a silica glass ingot having a hydrogen molecule concentration of $1 \times 10^{17}$ molecules/cm$^3$ or more is heated to a temperature of 1200–1350K and the ingot is retained at this temperature for a given period of time. When the retention temperature exceeds 1350K, hydrogen molecules escape in a large amount during retention of the ingot and, as a result, a silica glass having a hydrogen molecule concentration of $1 \times 10^{17}$ molecules/cm: cannot be obtained. Moreover, the surface of the silica glass is degraded. When the retention temperature is lower than 1200K, the structure determination temperature cannot be lowered to 1200K or lower in a given period, and, furthermore, annealing is insufficient and strain cannot be removed. The retention time is preferably a period of longer than the structure relaxation time at the retention temperature, especially preferably 1–24 hours. For example, in the case of the silica glass having a structure determination temperature of 1300K or higher and containing OH group in an amount of about 1000 ppm, the structure relaxation time at 1273K is 280 seconds. The heating rate (temperature-rising rate) does not affect the properties of the resulting silica glass, but is preferably less than about 150K/hr.

Then, the above silica glass ingot is cooled to a temperature (annealing completion temperature (a.c.t.) of 1000K or lower, preferably 873K or lower at a cooling rate (annealing rate or temperature-lowering rate for annealing) of 50 k/hr or less, preferably 20K/hr or less, thereby to anneal the ingot. When the annealing completion temperature is higher than 1000K or the annealing rate (temperature-lowering rate) is higher than 50 k/hr, the structure determination temperature cannot be lowered to 1200K or lower and, besides, strain cannot be sufficiently removed.

After the ingot reaches the above annealing completion temperature, usually it is air-cooled or spontaneously cooled to room temperature, though this is not essential. The atmosphere of the above annealing step is unlimited and may be air. The pressure is also unlimited and may be atmospheric pressure.

Furthermore, the method of the present invention preferably additionally includes, prior to the annealing step, a step of hydrolyzing a silicon compound such as $SiCl_4$, $SiHCl_3$ or the like in a flame (preferably oxy-hydrogen flame) to obtain fine glass particles (glass soot) and depositing and fusing the fine glass particles to obtain the silica glass ingot having a hydrogen molecule concentration of $1 \times 10^{17}$ molecules/cm$^3$ or more.

As mentioned above, the silica glass ingot of the present invention is preferably prepared by the above-mentioned direct method, namely, oxy-hydrogen flame hydrolysis. That is, $\equiv$Si—Si$\equiv$ bond, $\equiv$Si—O—O—Si$\equiv$ bond and the like are known as the precursors which cause formation of structural defects when synthetic silica glass is irradiated with ultraviolet light, and synthetic glasses obtained by so-called soot methods (VAD method, OVD method) or plasma method have these precursors. On the other hand, synthetic silica glasses produced by the direct method have no incomplete structures of oxygen-shortage or -excessive type formed by deviation from the stoichiometric ratio. Furthermore, high purity of low metallic impurities can generally be attained in the synthetic silica glasses produced by the direct method. Moreover, since the silica glasses synthesized by the direct method generally contain more than several hundred ppm of OH group, they are structurally more stable as compared with silica glasses containing no OH group.

The silica glass synthesized by the so-called direct method which comprises hydrolyzing silicon chloride with oxy-hydrogen flame and depositing the resulting silica fine glass particles on a target and melting it to form a silica glass ingot has a structure determination temperature of 1300K or higher at the state just after synthesis.

In order to obtain a silica glass ingot having a hydrogen molecule concentration of $1\times10^{17}$ molecules/cm$^3$ or more by the direct method, it is preferred that the volume ratio of oxygen gas to hydrogen gas ($O_2/H_2$) in the flame is 0.2–0.5. When this ratio (oxygen hydrogen gas ratio) is more than 0.5, it tends to occur that the resulting silica glass ingot does not contain $1\times10^{17}$ molecules/cm$^3$ or more of hydrogen molecule. Such oxygen gas and hydrogen gas ratio has the effects to allow hydrogen molecule in the above range to be dissolved in silica glass, but also to optimize the OH group concentration to the range of 500–1300 ppm. Accordingly, by reducing the oxygen gas and hydrogen gas ratio in the oxy-hydrogen flame to lower than the stoichiometric ratio 0.5, concentrations of OH group and hydrogen molecule can be simultaneously optimized at the synthesis of the silica glass ingot.

On the other hand, it is also possible to add hydrogen molecules by subjecting the silica glass ingot to a heat treatment in a hydrogen-containing atmosphere as a secondary treatment. That is, the method of the present invention may further includes, prior to the annealing step, a step of hydrolyzing a silicon compound in a flame to obtain fine glass particles and depositing and melting the fine glass particles to obtain a silica glass ingot and a step of heat treating the glass ingot in a hydrogen-containing atmosphere to obtain a silica glass ingot having a hydrogen molecule concentration of $1\times10^{17}$ molecules/cm$^3$ or more. The hydrogen-containing atmosphere is preferably an inert gas atmosphere containing hydrogen gas in an amount of 10–100 vol %, and the heat treating temperature is preferably 400–1000K, and the pressure is preferably 2–10 atm.

Figure 4:
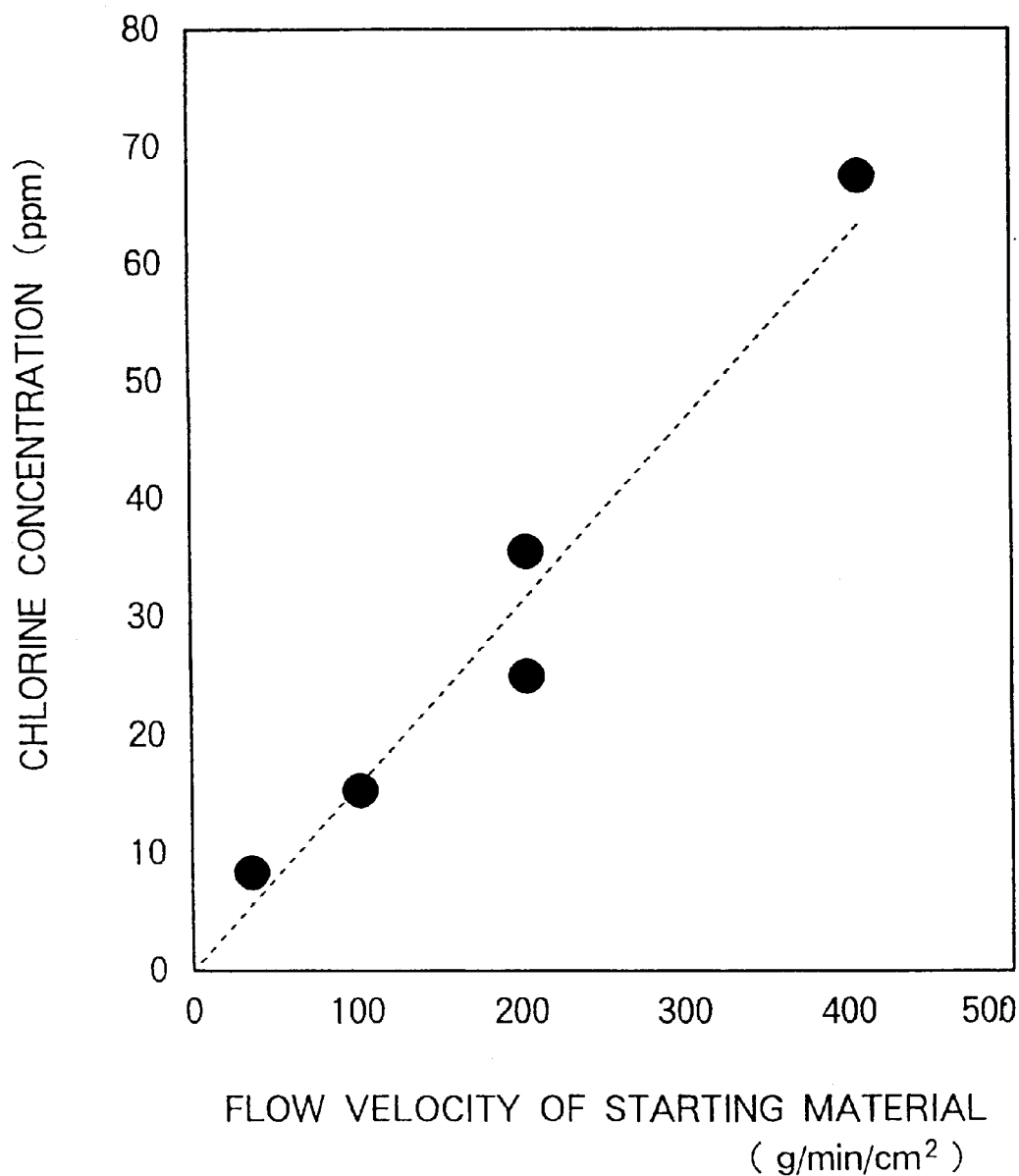
FIG. 4 is a graph which shows the relation between flow rate of starting material and chlorine concentration.

In the case of synthesis by the direct method, since the silica glass is synthesized in a short time by high-temperature synthesis using oxy-hydrogen flame, an equilibrium reaction is not sufficiently carried out and unreacted components may remain. The unreacted components include chlorine which necessarily dissolves and remains in the silica glass when $SiCl_4$ or $SiHCl_3$ is used as a starting material. It is considered that these unreacted components give unstability to the basic structure of the silica glass and produce harmful defects due to irradiation with ultraviolet light to result in reduction in transmittance. Accordingly, silica glass ingots were prepared with changing flow velocity of the starting material gas at the top of burner by the combination of feed amount of the starting material and inner diameter of starting material feeding tube, and chlorine concentration of the resulting silica glass ingots was measured. Correlation between the flow velocity of the starting material and the chlorine concentration is shown in FIG. 4. As a result, it has been found that the flow velocity of the starting material and the chlorine concentration are in proportion when oxygen gas is used as a carrier gas fed together with the starting material. From this result, it has become clear that in production of silica glass by the direct method, the chlorine concentration can be reduced to 50 ppm or lower when the flow velocity of the starting material at the top portion of the burner is 350 g/min/cm$^2$ or less. For attaining a chlorine concentration of 10 ppm or lower, the flow velocity of the starting material may be 70 g/min/cm$^2$ or less. In order to reduce the chlorine concentration as mentioned above, it is effective to accelerate the hydrolysis reaction of the starting material by enhancing the dispersibility of the starting material in the oxy-hydrogen flame as well as to reduce the amount of the starting material to be fed.

Furthermore, in the method of the present invention, the effect of the above-mentioned annealing is attained more effectively and uniformly by cutting the silica glass ingot to make blanks having a given size and then, annealing them.

EXAMPLES 1–12 AND COMPARATIVE EXAMPLES 1–8

Figure 5:
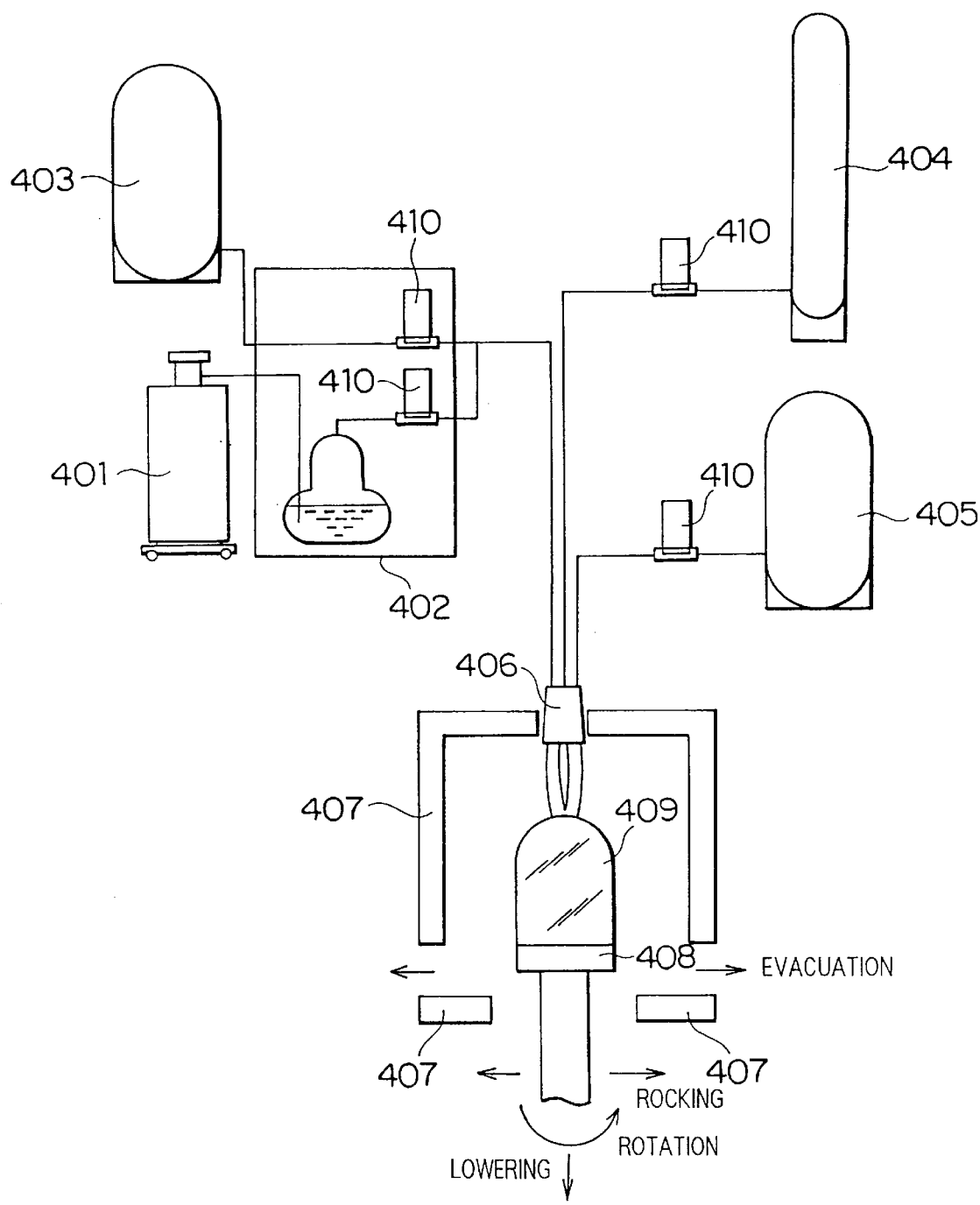
FIG. 5 is a schematic view of one example of the apparatus for producing a silica glass ingot according to the present invention.

A silica glass ingot was produced using the apparatus for producing silica glass as shown in FIG. 5. That is, high purity silicon tetrachloride (starting material) fed from silicon tetrachloride bomb 401 was mixed with a carrier gas fed from oxygen gas bomb 403 in baking system 402, and the mixture was fed to silica glass burner 406 together with hydrogen gas fed from hydrogen bomb 404 and oxygen gas fed from oxygen gas bomb 405. Oxygen gas and hydrogen gas in flow rates shown in Table 1 were mixed and burnt in the burner 406 and the starting material gas in the flow rate shown in Table 1 was diluted with a carrier gas (oxygen gas) and ejected from the central part to obtain silica fine glass particles ($SiO_2$ fine particles). The silica fine glass particles were deposited on target 408 surrounded by refractory 407 and molten to obtain silica glass ingot 409 (500 mm long) having the composition shown in Table 1. In this case, the upper face (synthesis face) was covered with flame and the target 408 was lowered at a constant speed with rotating and rocking at a constant period. The structure determination temperature of the silica glass at this stage was 1400K. The reference numeral 410 in FIG. 5 indicates a mass flow controller and R in Table 1 indicates an oxygen hydrogen ratio ($O_2/H_2$).

Figure 6:
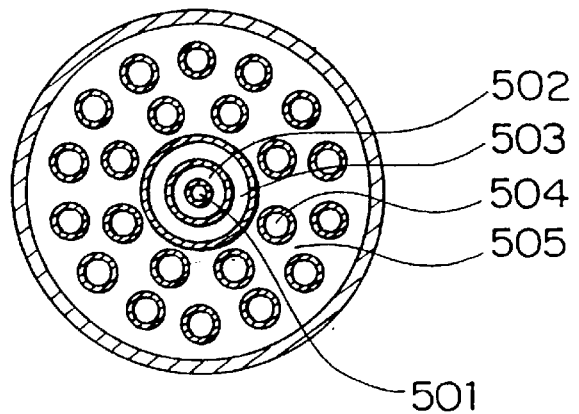
FIG. 6 is a bottom view of one example of a burner for producing a silica glass ingot according to the present invention.

The burner 406 has quintuple tube structure as shown in FIG. 6, and 501 indicates an ejection port for starting material and carrier gas 502 indicates an ejection port for inner side oxygen gas (OI), 503 indicates an ejection port for inner side hydrogen gas (HI), 504 indicates an ejection port for outer side oxygen gas (OO), and 505 indicates an ejection port for outside hydrogen gas (HO). The size (mm) of the ejection port is as follows.

| Burner A | Inner diameter | Outer diameter |
| --- | --- | --- |
| 501 | 6.0 | 9.0 |
| 502 | 12.0 | 15.0 |
| 503 | 17.0 | 20.0 |
| 504 | 3.5 | 6.0 |
| 505 | 59.0 | 63.0 |

| Burner B | Inner diameter | Outer diameter |
| --- | --- | --- |
| 501 | 3.5 | 6.5 |
| 502 | 9.5 | 12.5 |
| 503 | 14.5 | 17.5 |
| 504 | 3.5 | 6.0 |
| 505 | 59.0 | 63.0 |

| Burner C | Inner diameter | Outer diameter |
| --- | --- | --- |
| 501 | 2.0 | 5.0 |
| 502 | 8.5 | 11.5 |
| 503 | 14.5 | 17.5 |
| 504 | 3.5 | 6.0 |
| 505 | 59.0 | 63.0 |

Figure 7:
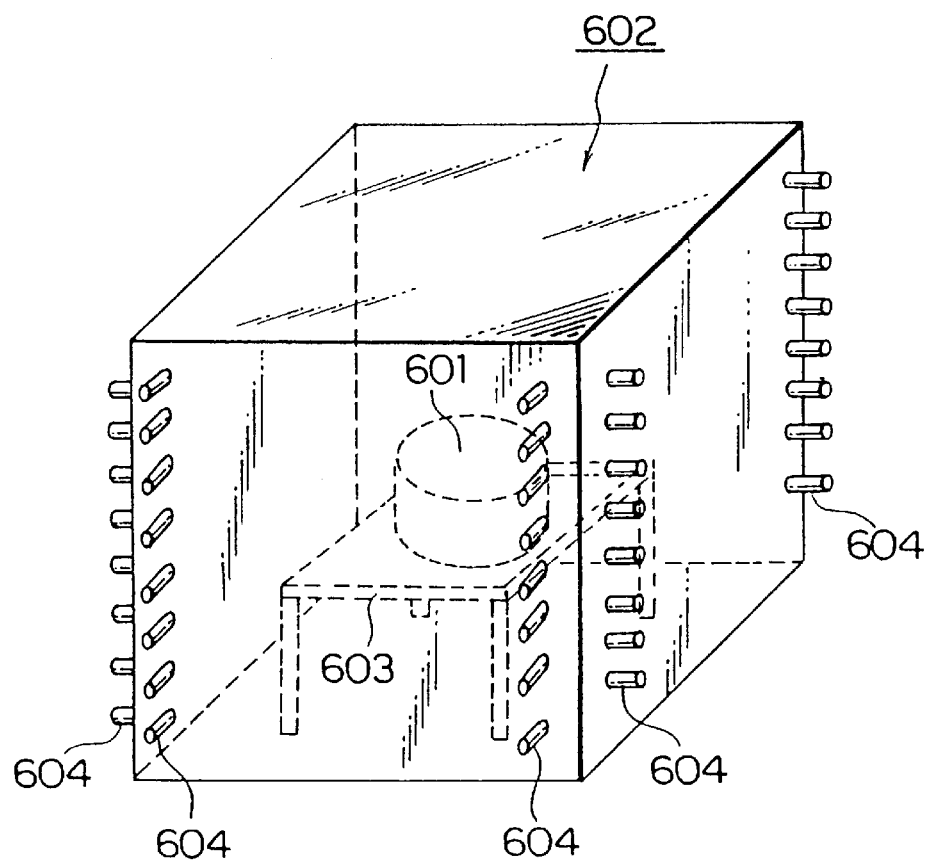
FIG. 7 is an oblique view of one example of an annealing furnace according to the present invention.

Then, a test piece to be irradiated with ArF excimer laser beam (60 mm in diameter and 10 mm in thickness, the opposite two sides being subjected to optical abrasion) was prepared from each of the resulting ingots. The test piece was placed in an annealing furnace made of an insulating firebrick as shown in FIG. 7 and heated to retention temperature from room temperature at a heating rate shown in Table 2. After lapse of the retention time, it was cooled to the annealing completion temperature from the retention temperature at an annealing rate (temperature-lowering rate) shown in Table 2 and, thereafter, spontaneously cooled to room temperature. The cooling rate after a.c.t. shown in Table 2 is a cooling rate one hour after starting of the spontaneous cooling Moreover, in FIG. 7, 601 indicates a test piece, 602 indicates an annealing furnace, 603 indicates a stand comprising a silica glass and legs made of a firebrick, and 604 indicates a rod-like SiC heating element.

TABLE 1

| Example/ Comparative Example | $H_2$ Concentration [mol./cm$^3$] | SiCl$_4$ GAS Cl Concentration [ppm] | Flow Rate [g/min] | Flow Velocity [g/min/cm$^2$] | Inner Side Oxygen · Hydrogen Gas HI [slm] | OI [slm] | R | Outer Side Oxygen · Hydrogen Gas HO [slm] | OO [slm] | R | Growing Rate of Ingot [mm/hr] | Diameter of Ingot [mm] | Inner Diameter of Tube for Starting Material [mmφ] |
|---|---|---|---|---|---|---|---|---|---|---|---|---|---|
| Ex. 1-6 & Comp. Ex. 1-4 | About $2.1 \times 10^{18}$ | 8.0 | 10 | 50 | 70 | 21 | 0.3 | 200 | 88 | 0.44 | 0.6 | 200 | 6.0 |
| Ex. 7-8 | About $1.1 \times 10^{17}$ | 8.0 | 10 | 50 | 70 | 30.8 | 0.44 | 200 | 88 | 0.44 | 0.6 | 200 | 6.0 |
| Comp. Ex. 5-6 | $<1 \times 10^{16}$ | 8.0 | 10 | 50 | 70 | 35 | 0.5 | 200 | 100 | 0.5 | 0.6 | 200 | 6.0 |
| Ex. 9 | About $2.1 \times 10^{18}$ | 50 | 30 | 330 | 150 | 45 | 0.3 | 360 | 158 | 0.44 | 4.0 | 250 | 3.5 |
| Ex. 10 | About $1.1 \times 10^{17}$ | 50 | 30 | 330 | 150 | 66 | 0.44 | 360 | 158 | 0.44 | 4.0 | 250 | 3.5 |
| Comp. Ex. 7 | $<1 \times 10^{16}$ | 50 | 30 | 330 | 150 | 75 | 0.5 | 360 | 180 | 0.5 | 4.0 | 250 | 3.5 |
| Ex. 11 | About $2.1 \times 10^{18}$ | 150 | 30 | 1000 | 150 | 45 | 0.3 | 400 | 176 | 0.44 | 8.0 | 180 | 2.0 |
| Ex. 12 | About $1.1 \times 10^{17}$ | 150 | 30 | 1000 | 150 | 66 | 0.44 | 400 | 176 | 0.44 | 8.0 | 180 | 2.0 |
| Comp. Ex. 8 | $<1 \times 10^{16}$ | 150 | 30 | 1000 | 150 | 75 | 0.5 | 400 | 200 | 0.5 | 8.0 | 180 | 2.0 |

TABLE 2

| Example/ Comparative Example | Ts [K] | Heating Rate [K/hr] | Retention Temp. [K] | Retention Time [hr] | Annealing Rate [K/hr] | Annealing Completion Temp. (a.c.t.) [K] | Cooling Rate After a.c.t. [K/hr] | $H_2$ Concentration [mol./cm$^3$] |
|---|---|---|---|---|---|---|---|---|
| Ex. 1 | 1023 | 100 | 1223 | 10 | 1.0 | 773 | 80 | $2 \times 10^{18}$ |
| Ex. 2 | 1073 | 100 | 1273 | 10 | 1.0 | 773 | 80 | $2 \times 10^{18}$ |
| Ex. 3 | 1123 | 100 | 1323 | 10 | 1.0 | 773 | 80 | $2 \times 10^{18}$ |
| Ex. 4 | 1150 | 100 | 1223 | 10 | 10 | 773 | 80 | $2 \times 10^{18}$ |
| Ex. 5 | 1173 | 100 | 1273 | 10 | 10 | 773 | 80 | $2 \times 10^{18}$ |
| Ex. 6 | 1198 | 100 | 1273 | 10 | 10 | 993 | 80 | $2 \times 10^{18}$ |
| Comp. Ex. 1 | 1223 | 100 | 1273 | 10 | 10 | 1173 | 80 | $2 \times 10^{18}$ |
| Comp. Ex. 2 | 1273 | 100 | 1273 | 10 | 100 | 773 | 80 | $2 \times 10^{18}$ |
| Comp. Ex. 3 | 1223 | 100 | 1373 | 10 | 10 | 773 | 80 | $5 \times 10^{16}$ |
| Comp. Ex. 4 | 1273 | 100 | 1473 | 10 | 10 | 773 | 80 | $<1 \times 10^{16}$ |
| Ex. 7 | 1073 | 100 | 1273 | 10 | 1.0 | 773 | 80 | $1 \times 10^{17}$ |
| Comp. Ex. 5 | 1073 | 100 | 1273 | 10 | 1.0 | 773 | 80 | $<1 \times 10^{16}$ |
| Ex. 8 | 1173 | 100 | 1273 | 10 | 10 | 773 | 80 | $1 \times 10^{17}$ |
| Comp. Ex. 6 | 1173 | 100 | 1273 | 10 | 10 | 773 | 80 | $<1 \times 10^{16}$ |
| Ex. 9 | 1173 | 100 | 1273 | 10 | 10 | 773 | 80 | $2 \times 10^{18}$ |
| Ex. 10 | 1173 | 100 | 1273 | 10 | 10 | 773 | 80 | $1 \times 10^{17}$ |
| Comp. Ex. 7 | 1173 | 100 | 1273 | 10 | 10 | 773 | 80 | $<1 \times 10^{16}$ |
| Ex. 11 | 1173 | 100 | 1273 | 10 | 10 | 773 | 80 | $2 \times 10^{18}$ |
| Ex. 12 | 1173 | 100 | 1273 | 10 | 10 | 773 | 80 | $1 \times 10^{17}$ |
| Comp. Ex. 8 | 1173 | 100 | 1273 | 10 | 10 | 773 | 80 | $<1 \times 10^{16}$ |

TABLE 3

| Example/ Comparative Example | Ts [K] | $H_2$ Concentration [mol./cm$^3$] | Cl Concentration [ppm] | OH Concentration [ppm] | n↑ | Δb [nm/cm] | Δd [μm] |
|---|---|---|---|---|---|---|---|
| Ex. 1 | 1023 | $2 \times 10^{18}$ | 8 | 900 | $1.9 \times 10^{-6}$ | 2.0 | 0.01 |
| Ex. 2 | 1073 | $2 \times 10^{18}$ | 8 | 900 | $2.0 \times 10^{-6}$ | 3.4 | 0.02 |
| Ex. 3 | 1123 | $2 \times 10^{18}$ | 8 | 900 | $2.0 \times 10^{-6}$ | 3.5 | 0.02 |
| Ex. 4 | 1150 | $2 \times 10^{18}$ | 8 | 900 | $2.3 \times 10^{-6}$ | 4.0 | 0.02 |
| Ex. 5 | 1173 | $2 \times 10^{18}$ | 8 | 900 | $2.4 \times 10^{-6}$ | 4.3 | 0.025 |

TABLE 3-continued

| Example/Comparative Example | Ts [K] | $H_2$ Concentration [mol./cm$^3$] | Cl Concentration [ppm] | OH Concentration [ppm] | n↑ | Δb [nm/cm] | Δd [μm] |
|---|---|---|---|---|---|---|---|
| Ex. 6 | 1198 | $2 \times 10^{18}$ | 8 | 900 | $4.0 \times 10^{-6}$ | 8.0 | 0.04 |
| Comp. Ex. 1 | 1223 | $2 \times 10^{18}$ | 8 | 900 | $6.5 \times 10^{-6}$ | 11 | 0.06 |
| Comp. Ex. 2 | 1273 | $2 \times 10^{18}$ | 8 | 900 | $6.5 \times 10^{-6}$ | 12 | 0.07 |
| Comp. Ex. 3 | 1223 | $5 \times 10^{16}$ | 8 | 900 | $8.0 \times 10^{-6}$ | 13 | 0.07 |
| Comp. Ex. 4 | 1273 | $<1 \times 10^{16}$ | 8 | 900 | $1.2 \times 10^{-5}$ | 20 | 0.10 |
| Ex. 7 | 1073 | $1 \times 10^{17}$ | 8 | 1100 | $5.5 \times 10^{-6}$ | 9.5 | 0.05 |
| Comp. Ex. 5 | 1073 | $<1 \times 10^{16}$ | 8 | 1250 | $1.0 \times 10^{-5}$ | 17 | 0.1 |
| Ex. 8 | 1173 | $1 \times 10^{17}$ | 8 | 1100 | $6.0 \times 10^{-6}$ | 10 | 0.05 |
| Comp. Ex. 6 | 1173 | $<1 \times 10^{16}$ | 8 | 1250 | $1.0 \times 10^{-5}$ | 17 | 0.1 |
| Ex. 9 | 1173 | $2 \times 10^{18}$ | 50 | 880 | $2.5 \times 10^{-6}$ | 4.3 | 0.025 |
| Ex. 10 | 1173 | $1 \times 10^{17}$ | 50 | 950 | $6.0 \times 10^{-6}$ | 10 | 0.05 |
| Comp. Ex. 7 | 1173 | $<1 \times 10^{16}$ | 50 | 950 | $1.0 \times 10^{-5}$ | 17.5 | 0.11 |
| Ex. 11 | 1173 | $2 \times 10^{18}$ | 150 | 600 | $4.0 \times 10^{-6}$ | 8 | 0.03 |
| Ex. 12 | 1173 | $1 \times 10^{17}$ | 150 | 600 | $8.0 \times 10^{-6}$ | 13 | 0.07 |
| Comp. Ex. 8 | 1173 | $<1 \times 10^{16}$ | 150 | 600 | $1.5 \times 10^{-5}$ | 25 | 0.14 |

Structure determination temperature (Ts), hydrogen molecule concentration, chlorine concentration and OH group concentration of these test pieces were measured. The results are shown in Table 3. The structure determination temperature was obtained by inversely calculating from measured 606 cm$^{-1}$ line intensity value based on the previously prepared calibration curve. The hydrogen molecule concentration was measured by a laser Raman spectro photometer. That is, among the Raman scattered lights perpendicular to the sample which occurred when the sample was irradiated with Ar$^+$ laser beam (output 800 mW), intensity of 800 cm$^{-1}$ and 4135 cm$^{-1}$ was measured and the ratio of the intensities was determined. The OH group concentration was measured by infrared absorption spectrometry (measurement of absorption by OH group for 1.38 μm). The chlorine concentration was measured by radioactivation analysis. In addition, quantitative analysis of metallic impurities (Mg, Ca, Ti, Cr, Fe, Ni, Cu. Zn, Co, Mn, Na, K) in the test pieces was conducted by inductively coupled plasma spectrometry to find that the concentrations of them were lower than 20 ppb, respectively.

Increment of refractive index (n↑) of the test pieces for the light having a wavelength of 633 nm after irradiated with $1 \times 10^6$ pulses of ArF excimer laser beam at an average one-pulse energy density: 100 mJ/cm$^2$ and a repeated frequency: 100 Hz was measured by the following method. That is, difference in refractive index of irradiated portion and unirradiated portion was measured by oil-on-plate method using an interferometer (Zygo Mark IV manufactured by Zygo Co. Ltd.) with He—Ne laser (wavelength 633 nm) as a light source.

Furthermore, amount of surface dent (Δd) of the test piece after irradiated with $1 \times 10^6$ pulses of ArF excimer laser beam was measured by surface roughness configuration measuring machine (SURFCOM 470A manufactured by Tokyo Seimitsu Co., Ltd.) having the following specification.

Measurer: Tip diamond, 5 μmR, 90° cone.
Measuring power: 4 mN (400 gf) or less.
Measuring precision: (0.05+1.5L/1000) μm (L: measuring range (mm))
Measuring range: 16 mm (magnification 50000) →measuring precision width=0.07 μm
Scan speed: 0.3 mm/sec→noise width=0.02 μm Furthermore, the maximum amount of strain (Δb) of the test pieces for the light having a wavelength of 633 nm after the central portion of the test pieces was irradiated with $5 \times 10^6$ pulses of ArF excimer laser beam at an average one-pulse energy density: 50 mJ/cm$^2$ and a repeated frequency: 100 Hz with a beam shape: 0.5×0.5 cm$^2$ was measured by the following method. That is, strain distribution was measured using an automatic double refraction measuring apparatus (ADR manufactured by Orc Manufacturing Co., Ltd.) with He—Ne laser (wavelength 633 nm) as a light source, and the maximum amount of strain was obtained from the data obtained. This apparatus measures a space distribution of amount of double refraction in an area of a material by measuring phase difference (amount of double refraction) when two refracted lights produced by the phenomenon of double refraction which occurs when one incident light passes through a distorted glass pass through a unit length.

The results are shown in Table 3. As is clear from Table 3, the silica glasses of the present invention (Examples 1–11) satisfied the desired conditions on all of the increment of refractive index, the amount of surface dent and the maximum amount of strain.

Figure 8:
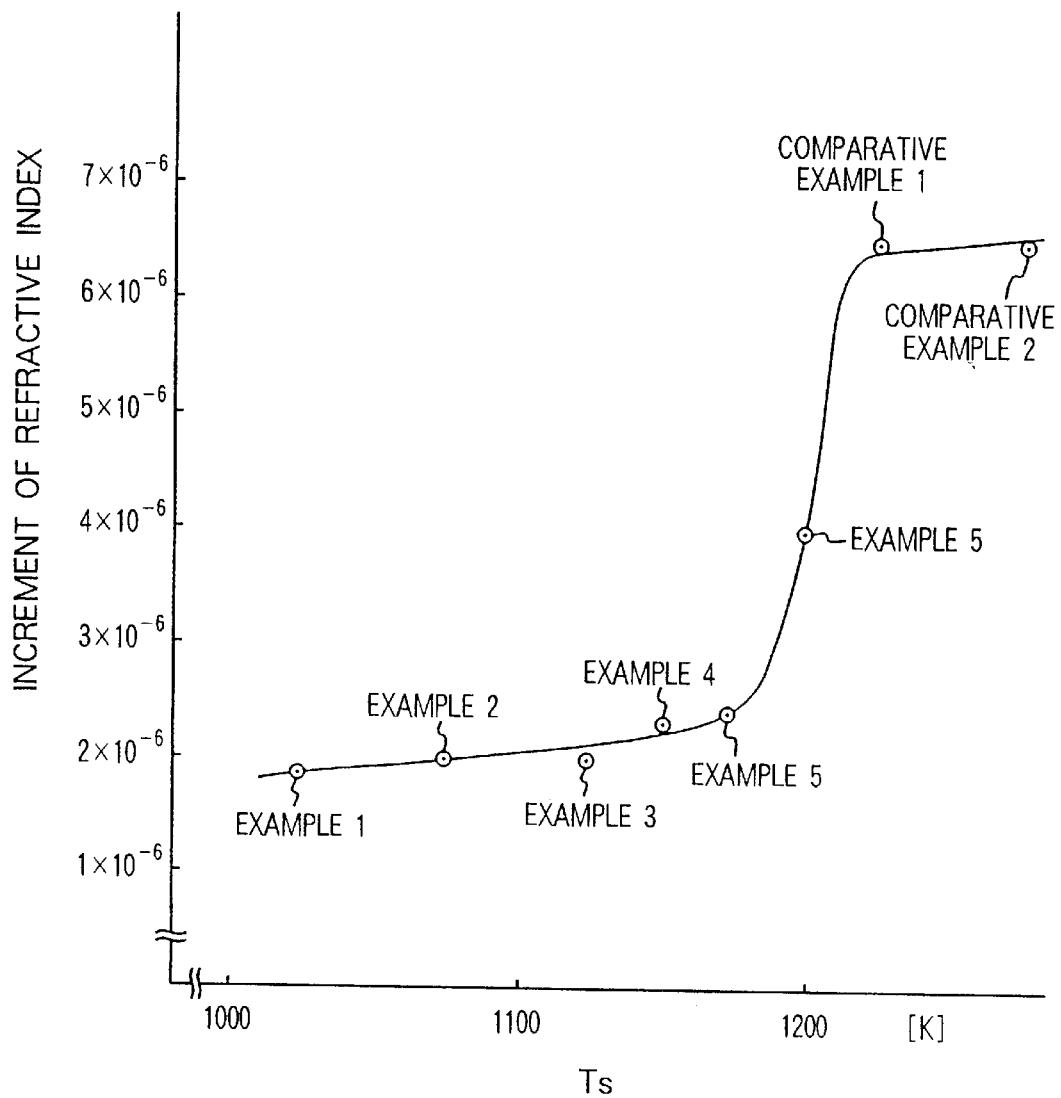
FIG. 8 is a graph which shows the relation between structure determination temperature and increment of refractive index.

Furthermore, as is clear from FIG. 8, when the hydrogen molecule concentration was $1 \times 10^{17}$ molecules/cm$^3$ or more, the increment of refractive index extremely decreased by reducing the structure determination temperature to 1200K or lower.

Figure 9:
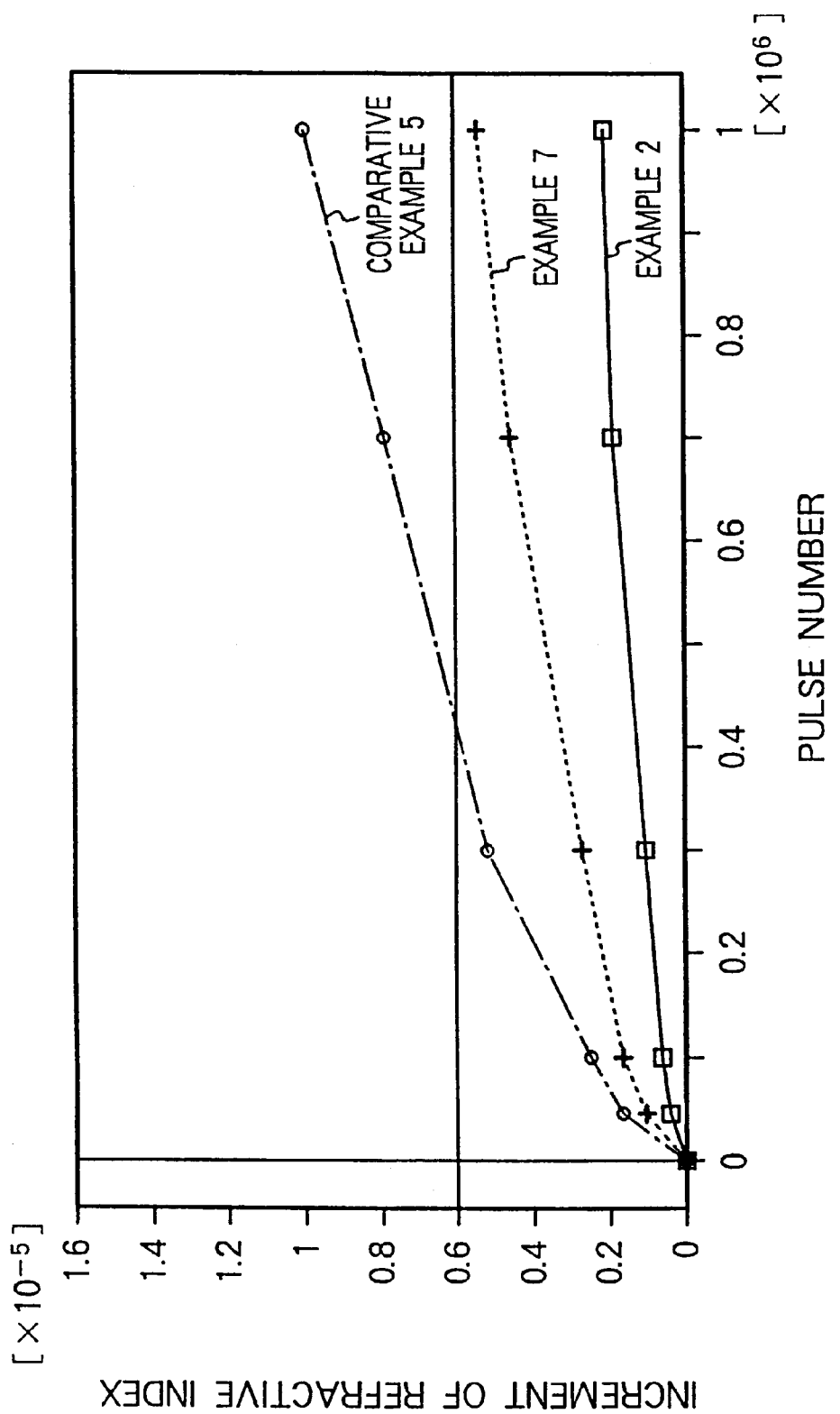
FIG. 9 is a graph which shows the relation between irradiation pulse number and increment of refractive index.

Moreover, as is clear from FIG. 9 which shows the relation between the pulse number of the irradiated laser beam and the increment of refractive index on the test pieces of Examples 2 and 7 and Comparative Example 5, even when the structure determination temperature is 1200K or lower, the desired condition of increment of refractive index was not satisfied if the hydrogen molecule concentration exceeded $1 \times 10^{17}$ molecules/cm$^3$.

COMPARATIVE EXAMPLE 9

A test piece of silica glass was prepared in the same manner as in Example 4, except that the retention temperature was 1123K. Since the structure was not relaxed during the retentions the structure determination temperature did not decrease to lower than 1200K and strain was not removed because the annealing was insufficient.

EXAMPLE 13 AND COMPARATIVE EXAMPLE 10

Two test pieces for irradiation with ArF excimer laser beam were prepared in the same manner as in Example 5, except that the oxygen gas and hydrogen gas ratio in the flame was $O/H_2=0.44$. These test pieces had a dissolved hydrogen molecule concentration of $2.5\times10^{18}$ molecules/$cm^3$. One of these test pieces was employed as a test piece of Example 13. Another test piece was subjected to dehydrogenation by vacuum heating treatment. The treating temperature was 973K and the treating time was 60 hours. This test piece was employed as a test piece of Comparative Example 10. Both the test pieces had an OH group concentration of about 1200 ppm.

Figure 10:
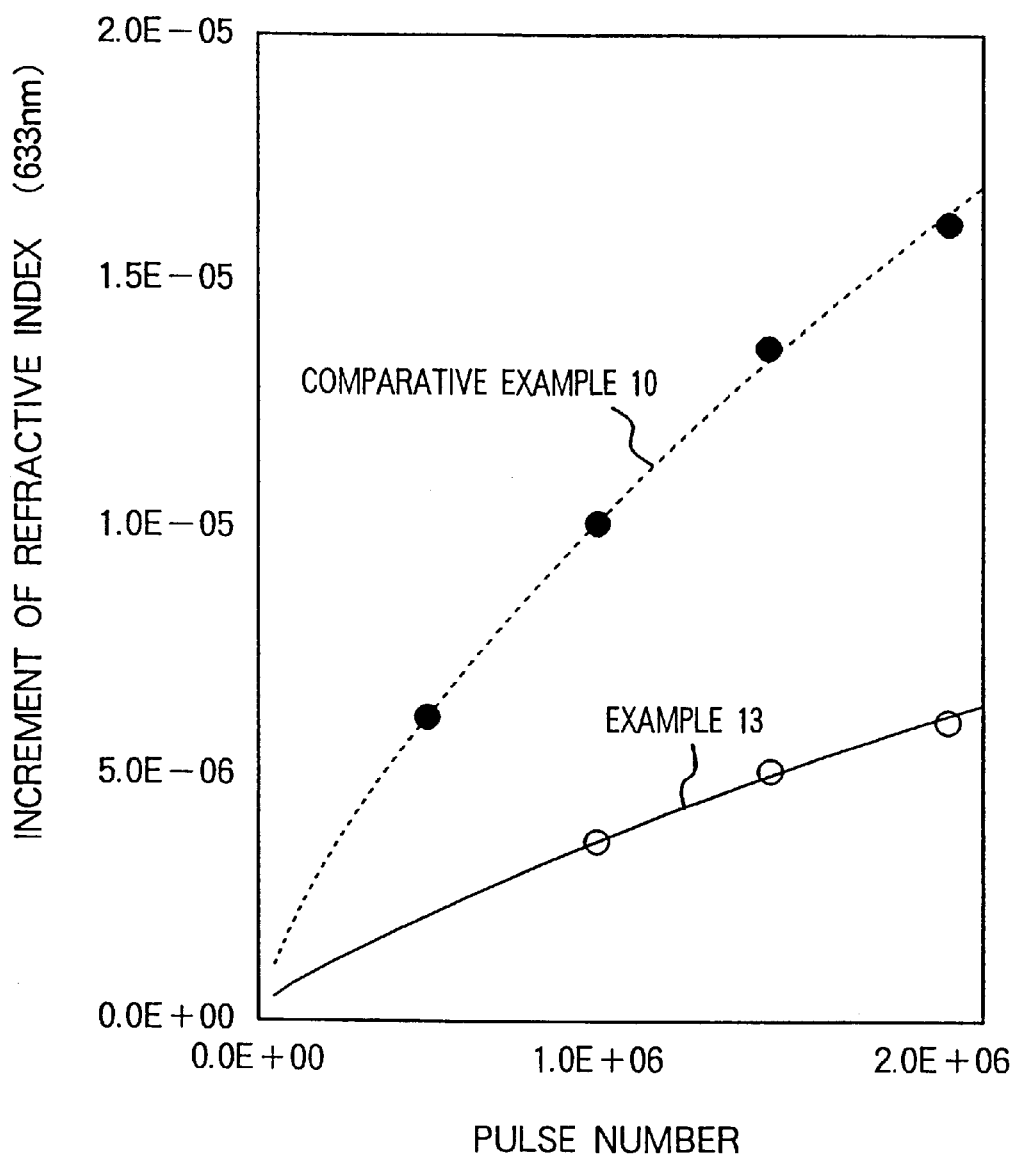
FIG. 10 is a graph which shows the relation between irradiation pulse number and increment of refractive index.

Change of refractive index (n↑) of the test pieces of Example 13 and Comparative Example 10 was measured in the same manner as in Example 5. The results are shown in FIG. 10. As is clear from FIG. 10, it was confirmed that the sample of Example 13 containing hydrogen molecules was inhibited from increase in refractive index caused by irradiation with excimer laser. Furthermore, since the increment of refractive index of the test piece of Example 13 was $3.5\times10^{-6}$ and that of the test piece of Comparative Example 10 was $1\times10^{-5}$ after irradiation with $1\times10^6$ pulses of the excimer laser beam, the test piece of Example 13 satisfied the requirement of the increment of refractive index: $6\times10^{-6}$ or less which is a condition of projection lens material for ArF excimer laser stepper.

Further, an amount of surface dent of the test piece was measured by the same manner of that in Example 5. Since the amount of the test piece of Example 13 was 0.03 μm and that of the test piece of Comparative Example 10 was 0.09 μm, the test piece of Example 13 satisfied the requirement of the amount of surface dent: 0.05 μm or less which is a condition of projection lens material for ArF excimer laser stepper.

EXAMPLE 14 AND COMPARATIVE EXAMPLE 11

Samples of Comparative Example 11 and Example 14 were prepared in the same manner as in Example 13, except that the structure determination temperatures were 1473K (1200° C.) and 1273K (1000° C.), respectively, and they were compared on increment of refractive index caused by irradiation with ArF excimer laser. As a result, it was confirmed that the sample of Example 14 having a structural determination temperature of 1273K was inhibited by about 20% in increment of refractive index as compared with the sample of Comparative Example 11. That is, the effect of the present invention was inhibited in the silica glass having a structure close to the ideal structure, namely, the silica glass less in structural defects.

EXAMPLE 15 AND COMPARATIVE EXAMPLE 12

Two test pieces for irradiation with ArF excimer laser beam were prepared in the same manner as in Example 5, except that hydrogen gas was used as the carrier gas. These test pieces had a dissolved hydrogen molecule concentration of $1\times10^{18}$ molecules/$cm^3$. One of these test pieces was employed as a test piece of Example 15. Another test piece was subjected to dehydrogenation by vacuum heating treatment. The treating temperature was 973K and the treating time was 60 hours. This test piece was employed as a test piece of Comparative Example 12. The test piece of Comparative Example 12 had a dissolved hydrogen molecule concentration of less than $5\times10^{16}$ molecules/$cm^3$. Both the test pieces had an OH group concentration of about 1200 ppm.

Change in the amount of strain of these test pieces of Example 15 and Comparative Example 12 was measured in the same manner as in Example 5.

Figure 11:
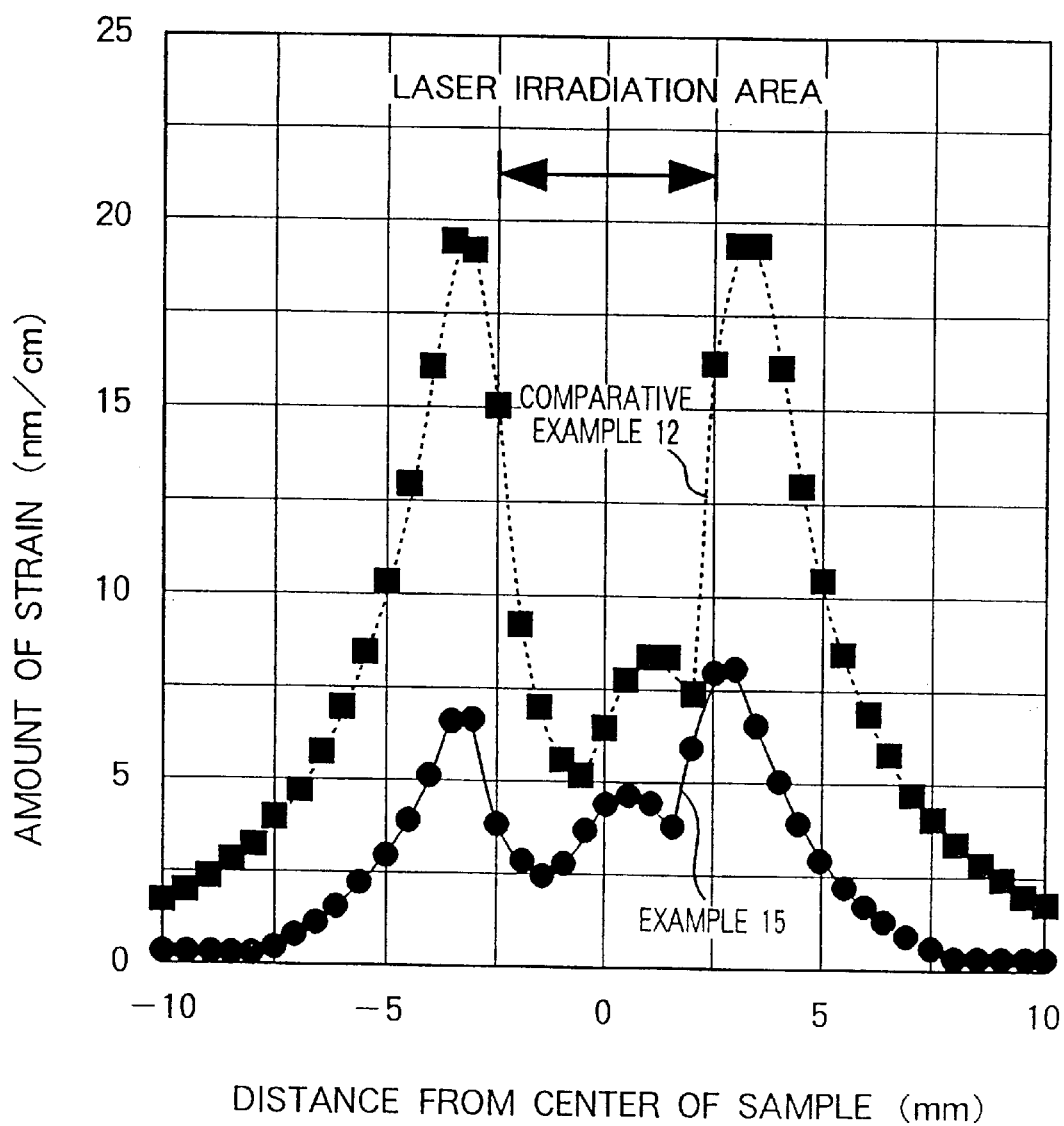
FIG. 11 is a graph which shows the relation between distance from the center of the sample and amount of strain.

FIG. 11 shows the distribution of amount of strain produced in the test pieces after irradiated with $5\times10^6$ pulses of laser beam. In FIG. 11, the range of from −2.5 mm to +2.5 mm of the abscissa axis shows the portion irradiated with ArF excimer laser beam. As is clear from FIG. 11, it was confirmed that the strain produced by the irradiation with excimer laser was concentrated at the boundary between the irradiated portion and the unirradiated portion. Change of the maximum amount of the strain produced at the boundary with the change of pulse number is shown in FIG. 12.

Figure 12:
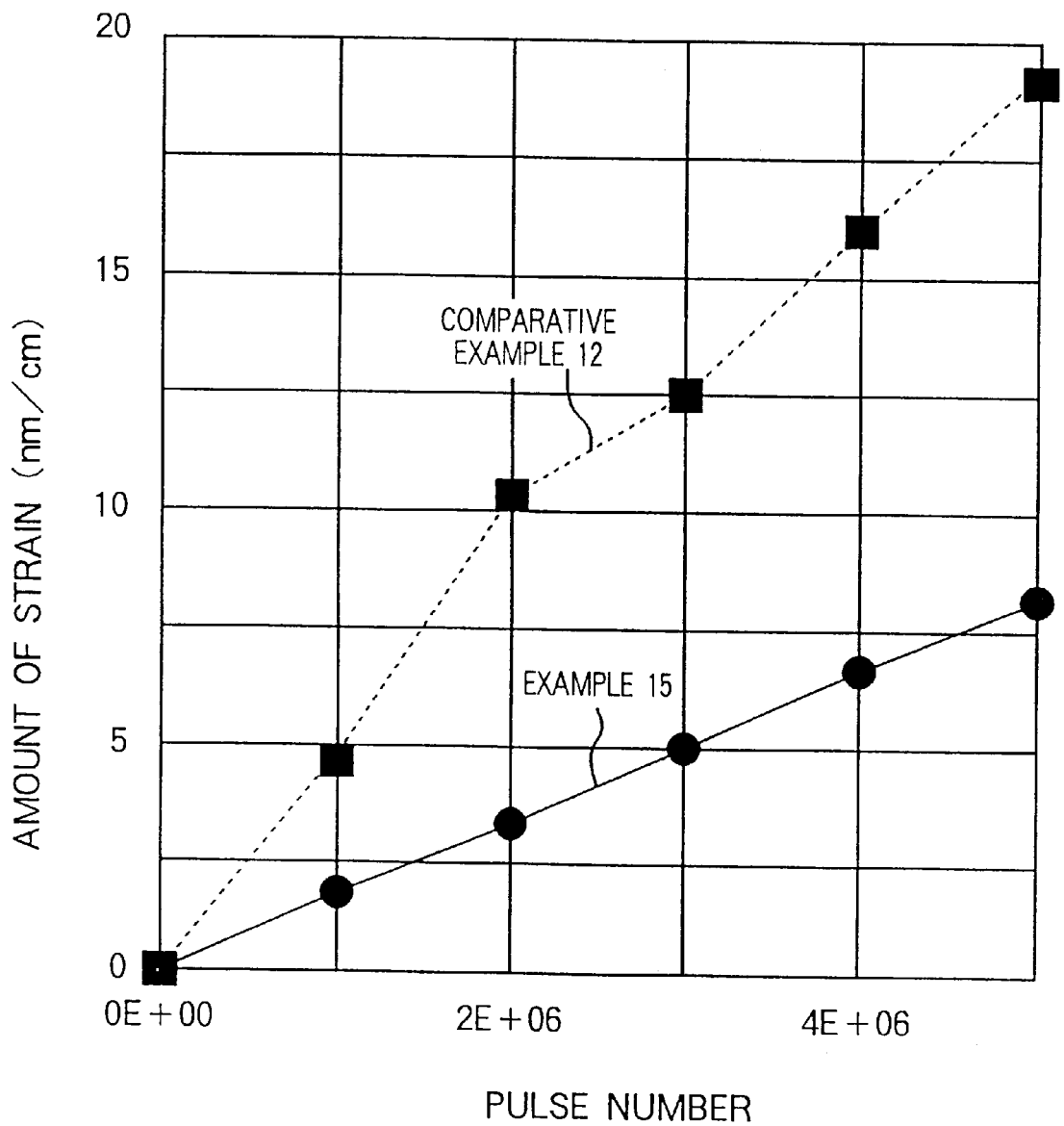
FIG. 12 is a graph which shows the relation between irradiation pulse number and amount of strain.

As is clear from FIG. 11 and FIG. 12, it was confirmed that the sample of Example 15 containing hydrogen molecules was inhibited from occurrence of strain due to the irradiation with excimer laser. Furthermore, since the maximum strain in the test piece of Example 15 was about 8 nm/cm and that of the test piece of Comparative Example 12 was about 20 nm/cm after irradiation with $5\times10^6$ pulses of the excimer laser beam, it was found that the test piece of Example 15 satisfied the requirement of the maximum strain: 10 nm/cm or less which is a condition of projection lens material for ArF excimer laser stepper.

COMPARATIVE EXAMPLES 13–14

Silica glass ingots of 180 mm in diameter and 500 mm in length were prepare in the same manner as in Example 5, except that the feeding amount of the starting material was 20 g/min, the oxygen hydrogen ratio was $O_2/H_2=0.44$, and the flow velocity at the top of the burner was 400 g/min/$cm^2$. A test piece for irradiation with ArF excimer laser was prepared from the ingot without subjecting to the heat treatment (annealing treatment) for making the structural determination temperature to 1300K or lowers and this was employed as a test piece of Comparative Example 13. Furthermore, the ingot was subjected to the annealing treatment in the same manner as in Example 15 and a test piece of Comparative Example 14 was prepared therefrom.

OH group concentration of these test pieces of Comparative Examples 13–14 was measured to obtain 1050 ppm for both the test pieces. Chlorine concentration of these test pieces was measured to obtain 67 ppm for both the test pieces. These test pieces of Comparative Examples 13–14 were kept at 973K for 60 hr in the same heat treating furnace with evacuating to $10^{-5}$ Torr by a diffusion pump (vacuum annealing) and, then, cooled to room temperature to perform dehydrogenation treatment, thereby to exclude the influence of the dissolved hydrogen molecule on laser resistance. Hydrogen molecule concentration was measured to find that the dissolved hydrogen molecules in the test pieces of Comparative Examples 13 and 14 less than the limit of detection ($1\times10^{16}$ molecules/$cm^3$). The structural determination temperature of the test pieces was not changed by the dehydrogenation treatment. Further, the test pieces were subjected to quantitative analysis on metallic impurities to obtain concentrations of less than 20 ppb. The structure determination temperature of the test piece of Comparative Example 14 was 1183K and that of the test piece of Comparative Example 13 was about 1320K.

The test pieces were irradiated with ArF excimer laser beam at an average one-pulse energy density: 100 mJ/cm, and a repeated frequency: 100 Hz and, thereafter, change in absorption coefficient for the light of 193 nm was examined.

Figure 13:
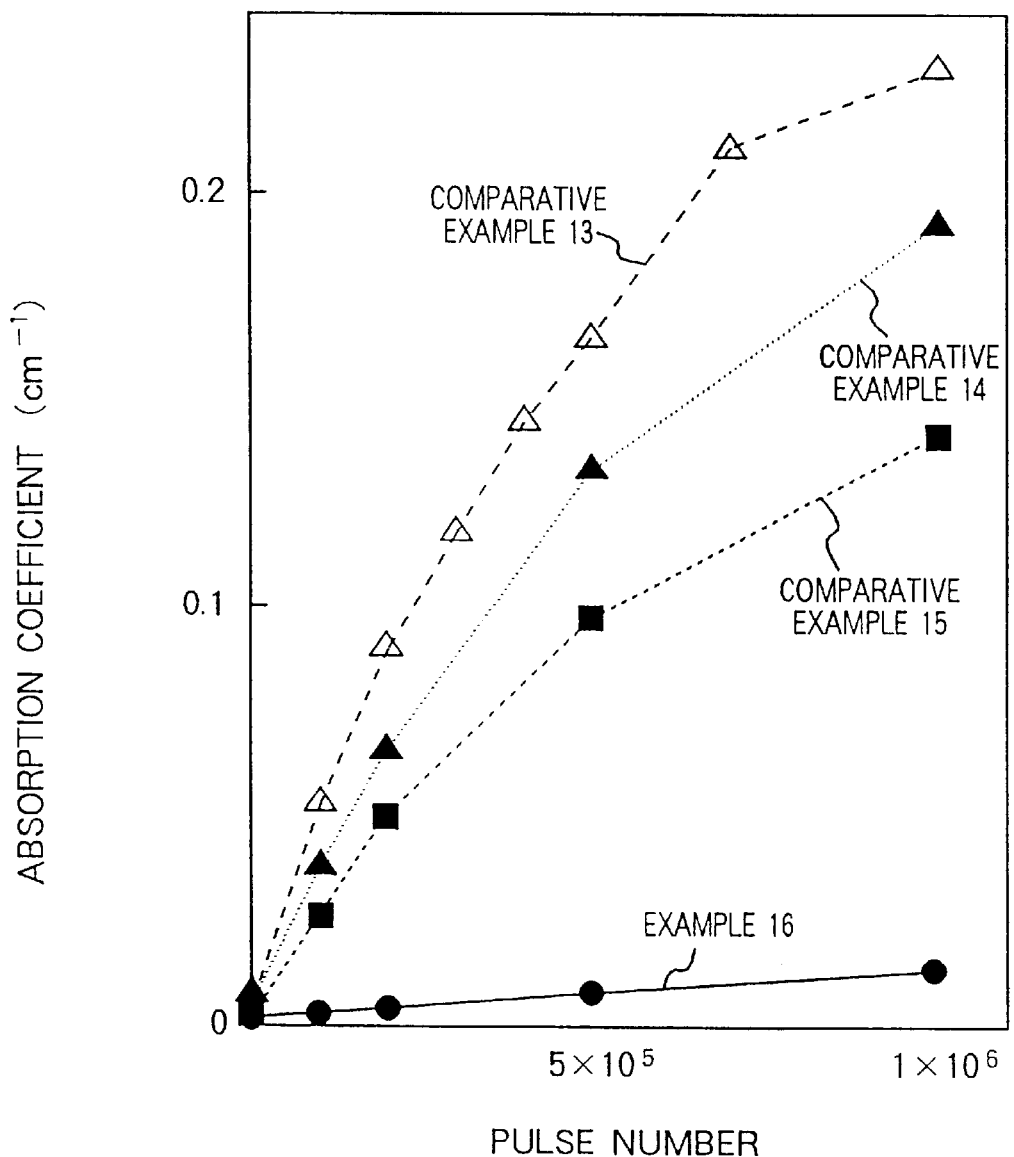
FIG. 13 is a graph which shows the relation between irradiation pulse number and change in absorption coefficient.

Absorption coefficient=ln(transmittance after irradiation/transmittance before irradiation)/thickness of test piece The results are shown in FIG. 13. As is clear from FIG. 13, the test piece of Comparative Example 14 was improved in excimer laser resistance over that of Comparative Example 13. That is, it was confirmed that the excimer laser resistance was improved by making the structure determination temperature to lower than 1200K.

COMPARATIVE EXAMPLE 15

A silica glass ingot of 250 mm in diameter and 500 mm in length was obtained in the same manner as in Example 5, except that the flow velocity of the starting material was 200 g/min/cm$^2$. OH group concentration of the test piece of Comparative Example 15 was 1200 ppm and the structure determination temperature was 1183K. Concentrations of metallic impurities of this test piece were all less than 20 ppb. Furthermore, the test piece of Comparative Example 15 was subjected to the dehydrogenation treatment in the same manner as in Comparative Example 14 to reduce the hydrogen molecule concentration to less than the limit of detection. Chlorine concentration of the test piece of Comparative Example 15 was 25 ppm and this was lower than in Comparative Example 14.

This test piece was subjected to the same ArF excimer laser irradiation test as in Comparative Example 14. The results are shown in FIG. 13. As can be seen from FIG. 13, the excimer laser resistance of the test piece of Comparative Example 15 was improved over the test piece of Comparative Example 14. That is, it was confirmed that the excimer laser resistance was improved by reducing the content of chlorine.

EXAMPLE 16

A test piece of Example 16 was prepared from the silica glass ingot prepared in Comparative Example 15 in the same manner as in Comparative Example 15, except that the dehydrogenation treatment was not carried out. The hydrogen molecule concentration of the test piece of Example 16 was 5×10$^{17}$ molecules/cm$^3$. Other properties of the test piece are similar to those in Comparative Example 15.

This test piece was subjected to the same ArF excimer laser irradiation test as in Comparative Example 15. The results are shown in FIG. 13. As can be seen from FIG. 13, the excimer laser resistance of the test piece of Example 16 was markedly improved over the test piece of Comparative Example 15. That is, it was confirmed that the excimer laser resistance was markedly improved by containing hydrogen molecules.

EXAMPLES 17–18

A silica glass ingot of Example 17 having a diameter of 250 mm and a length of 500 mm was prepared in the same manner as in Example 5, except that the feeding amount of the starting material was 20 g/min, the inner diameter of the tube for starting material of the burner was 3.5 mm, and the flow velocity of the starting material at the top of the burner was about 200 g/min/cm$^2$. A silica glass ingot of Example 18 having a diameter of 120 mm and a length of 480 mm was prepared in the same manner as in Example 17, except that the feeding amount of the starting material was 50 g/min and the flow velocity of the starting material at the top of the burner was about 500 g/min/cm$^2$.

OH group concentration of these silica glass ingots was measured to obtain 1150 ppm for Example 17 and 600 ppm for Example 18. The structure determination temperature of Examples 17 and 18 was both 1183K. Furthermore, these ingots were subjected to quantitative analysis of metallic impurities to find that concentrations of metallic impurities were all; less than 20 ppb in both the Examples 17 and 18.

Chlorine content in the ingot of Example 17 was 25 ppm and that in the ingot of Example 18 was 80 ppm. The dissolved hydrogen molecule concentration was measured to find that the ingot of Example 17 had 5.0×10$^{17}$ molecules/cm$^3$ and that of Example 18 had 6.5×10$^{17}$ molecules/cm$^3$. Test pieces for irradiation with ArF excimer laser were prepared from these silica glass ingots of Examples 17 and 18 in the same manner as in Example 5.

Figure 14:
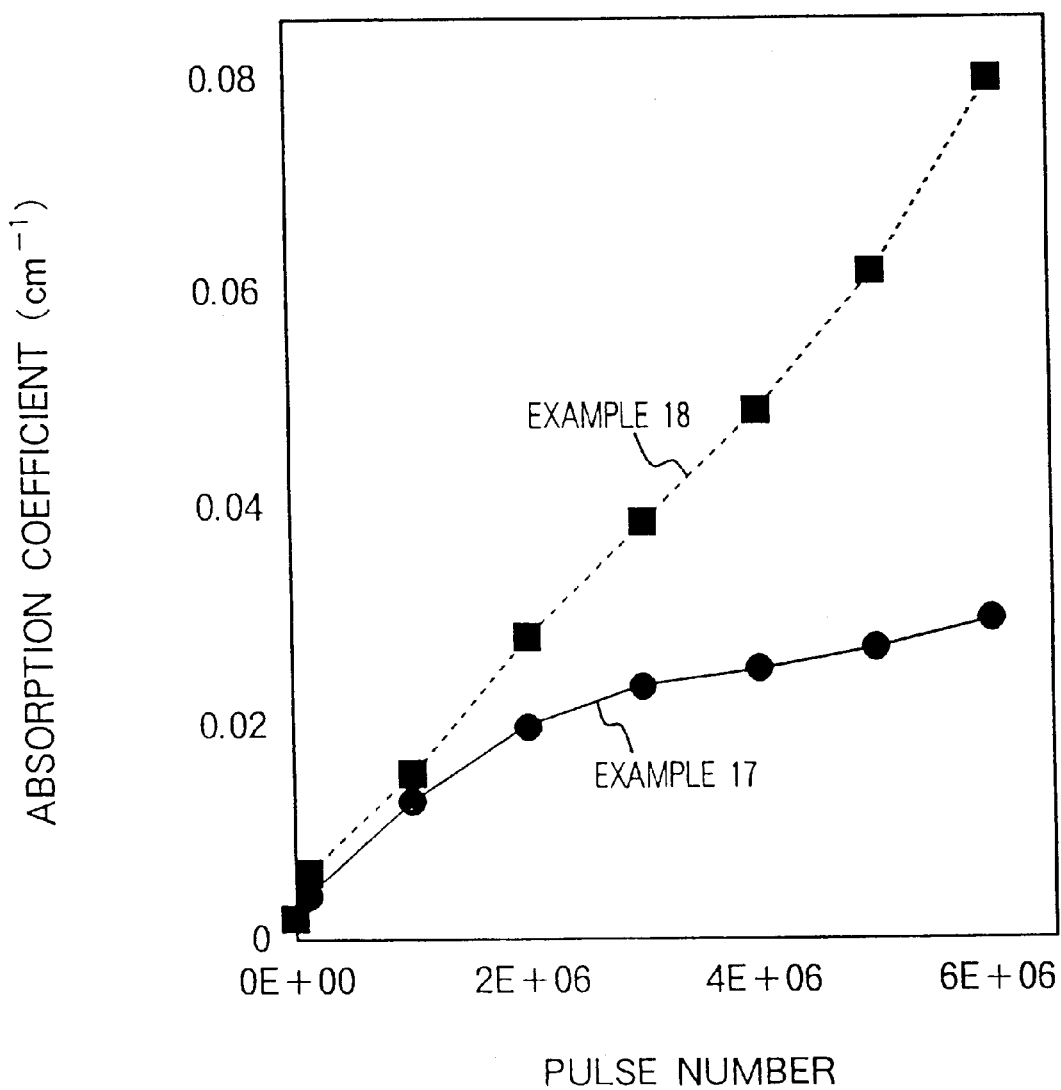
FIG. 14 is a graph which shows the relation between irradiation pulse number and change in absorption coefficient.

Change in absorption coefficient for the light of 193 nm of the resulting test pieces after irradiated with ArF excimer laser beam is shown in FIG. 14. That is, as can be seen from FIG. 14, the test piece of Example 17 less in chlorine content was improved in excimer laser resistance that that of Example 18.

As explained above, according to the present invention, production of the structural defects per se in silica glasses can be inhibited, and, thus, silica glasses which are sufficiently inhibited from increase of refractive index and production of dents and strain even after irradiated with ultraviolet light or excimer laser beams of short wavelength and high output and are improved in ultraviolet light resistance can be obtained, and, furthermore, optical members containing said silica glasses can be obtained.

From the invention thus described, it will be obvious that the invention may be varied in many ways. Such variations are not to be regarded as a departure from the spirit and scope of the invention, and all such modifications as would be obvious to one skilled in the art are intended for inclusion within the scope of the following claims.

The basic Japanese Application Nos. 000479/1995 (7-000479) filed on Jan. 6, 1995, 061038/1995 (7-061038) filed on Mar. 20, 1995, 061039/1995 (7-061039) filed on Mar. 20, 1995, 096687/1995 (7-096687) filed on Apr. 21, 1995, and 164040/1995 (7-164040) filed on Jun. 29, 1995 are hereby incorporated by reference.

What is claimed is:

1. A method for producing a silica glass having a structure determination temperature of 1200K or lower and a hydrogen molecule concentration of 1×10$^{17}$ molecules/cm$^3$ or more, comprising the steps of heating a silica glass ingot having a hydrogen molecule concentration of 1×10$^{17}$ molecules/cm$^3$ or more to a temperature of 1200–1350K, retaining the ingot at that temperature for a given period of time, and then, cooling the ingot to a temperature of 1000K or lower at a temperature-lowering rate of 50K/hr or less to anneal the ingot.

2. A method according to claim 1, further comprising a step of hydrolyzing a silicon compound in a flame to obtain fine glass particles, and depositing and melting the fine glass particles to obtain the silica glass ingot having a hydrogen molecule concentration of 1×10$^{17}$ molecules/cm$^3$ or more.

3. A method according to claim 2, wherein a volume ratio of oxygen gas to hydrogen gas in the flame is 0.2–0.5.

4. A method according to claim 2, wherein a flow velocity of the silicon compound fed to the flame is 350 g/min/cm$^2$ or less.

5. A method according to claim 1, further comprising a step of hydrolyzing a silicon compound in a flame to obtain fine glass particles, and depositing and melting the fine glass particles to obtain a silica glass ingot, and a step of heat treating the ingot in a hydrogen gas-containing atmosphere to obtain the silica glass ingot having a hydrogen molecule concentration of 1×10$^{17}$ molecules/cm$^3$ or more.

6. A method according to claim 5, wherein a flow velocity of the silicon compound fed to the flame is 350 g/min/cm$^2$ or less.

* * * * *